(12) United States Patent
Lu et al.

(10) Patent No.: US 12,113,042 B2
(45) Date of Patent: Oct. 8, 2024

(54) METAL BONDING STRUCTURE AND MANUFACTURING METHOD THEREOF

(71) Applicant: Taiwan Semiconductor Manufacturing Company, Ltd., Hsinchu (TW)

(72) Inventors: Chun-Liang Lu, Tainan (TW); Wei-Lin Chen, Tainan (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 114 days.

(21) Appl. No.: 17/450,104

(22) Filed: Oct. 6, 2021

(65) Prior Publication Data

US 2022/0310550 A1    Sep. 29, 2022

Related U.S. Application Data

(60) Provisional application No. 63/166,726, filed on Mar. 26, 2021.

(51) Int. Cl.
*H01L 23/00* (2006.01)

(52) U.S. Cl.
CPC .............. *H01L 24/73* (2013.01); *H01L 24/11* (2013.01); *H01L 24/17* (2013.01); *H01L 2224/11466* (2013.01); *H01L 2224/11845* (2013.01); *H01L 2224/1703* (2013.01); *H01L 2224/73104* (2013.01); *H01L 2224/9211* (2013.01)

(58) Field of Classification Search
CPC ......... H01L 24/08; H01L 24/11; H01L 24/17; H01L 24/73; H01L 24/80; H01L 24/94; H01L 2224/80097; H01L 2224/11466; H01L 2224/03334; H01L 2224/73104; H01L 2224/08121; H01L 2224/9211; H01L 2224/08058; H01L 2224/09051; H01L 2224/08145; H01L 2224/06505; H01L 2224/80895; H01L 2224/80203; H01L 2224/80815; H01L 2224/11845; H01L 2224/80357; H01L 23/528; H01L 24/05; H01L 2924/00012; H01L 2224/94; H01L 2224/80001; H01L 2224/045; H01L 2924/00014
USPC ........................................................ 257/777
See application file for complete search history.

(56) References Cited

U.S. PATENT DOCUMENTS

| | | | | |
|---|---|---|---|---|
| 9,425,155 B2* | 8/2016 | Liu | ..................... | H01L 25/0657 |
| 10,790,189 B2* | 9/2020 | Kuang | ..................... | H01L 24/80 |
| 10,867,879 B2* | 12/2020 | Yu | ............................ | H01L 24/19 |
| 10,910,782 B2* | 2/2021 | Vandroux | ......... | H01L 21/02074 |
| 11,424,205 B2* | 8/2022 | Chen | ....................... | H01L 24/06 |

(Continued)

*Primary Examiner* — Khiem D Nguyen
(74) *Attorney, Agent, or Firm* — Harrity & Harrity, LLP

(57) ABSTRACT

Some implementations described herein provide a semiconductor structure. The semiconductor structure includes a first wafer including a first metal structure within a body of the first wafer. The semiconductor structure also includes a second wafer including a second metal structure within a body of the second wafer, where the first wafer is coupled to the second wafer at an interface. The semiconductor structure further includes a metal bonding structure coupled to the first metal structure and the second metal structure and extending through the interface.

20 Claims, 22 Drawing Sheets

(56) References Cited

U.S. PATENT DOCUMENTS

| | | | |
|---|---|---|---|
| 2007/0015340 A1* | 1/2007 | Kobrinsky | H01L 25/50 257/E21.705 |
| 2015/0294963 A1* | 10/2015 | Lin | H01L 25/50 438/107 |
| 2017/0250160 A1* | 8/2017 | Wu | H01L 25/0657 |
| 2018/0005977 A1* | 1/2018 | Lin | H01L 21/76898 |
| 2020/0243455 A1* | 7/2020 | Wang | H10B 41/50 |
| 2020/0243466 A1* | 7/2020 | Kim | H01L 24/33 |
| 2020/0251443 A1* | 8/2020 | Kanakamedala | H01L 25/18 |
| 2020/0335450 A1* | 10/2020 | Wang | H10B 43/27 |
| 2021/0028135 A1* | 1/2021 | Said | H01L 24/80 |
| 2021/0375790 A1* | 12/2021 | Oda | H01L 23/58 |
| 2022/0199559 A1* | 6/2022 | Fang | H01L 24/09 |

* cited by examiner

METAL BONDING STRUCTURE AND MANUFACTURING METHOD THEREOF

CROSS-REFERENCE TO RELATED APPLICATION

This patent application claims priority to U.S. Provisional Patent Application No. 63/166,726, filed on Mar. 26, 2021, and entitled "METAL BONDING STRUCTURE." The disclosure of the prior application is considered part of and is incorporated by reference into this patent application.

BACKGROUND

A three dimensional integrated circuit (3DIC) is a type of semiconductor packaging in which multiple semiconductor dies are stacked upon one another using, for example, package-on-package (PoP) or system-in-package (SiP) packaging techniques. A 3DIC provides improved integration density and other advantages, such as faster speeds and higher bandwidth, because of a decrease in lengths of interconnects between stacked dies, for example.

Hybrid bonding is a type of bonding procedure for a 3DIC or another type of electronic device, where two semiconductor wafers are bonded together. Hybrid bonding methods include forming non-metal to non-metal bonds using fusion bonding and forming metal-to-metal bonds using eutectic metal bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
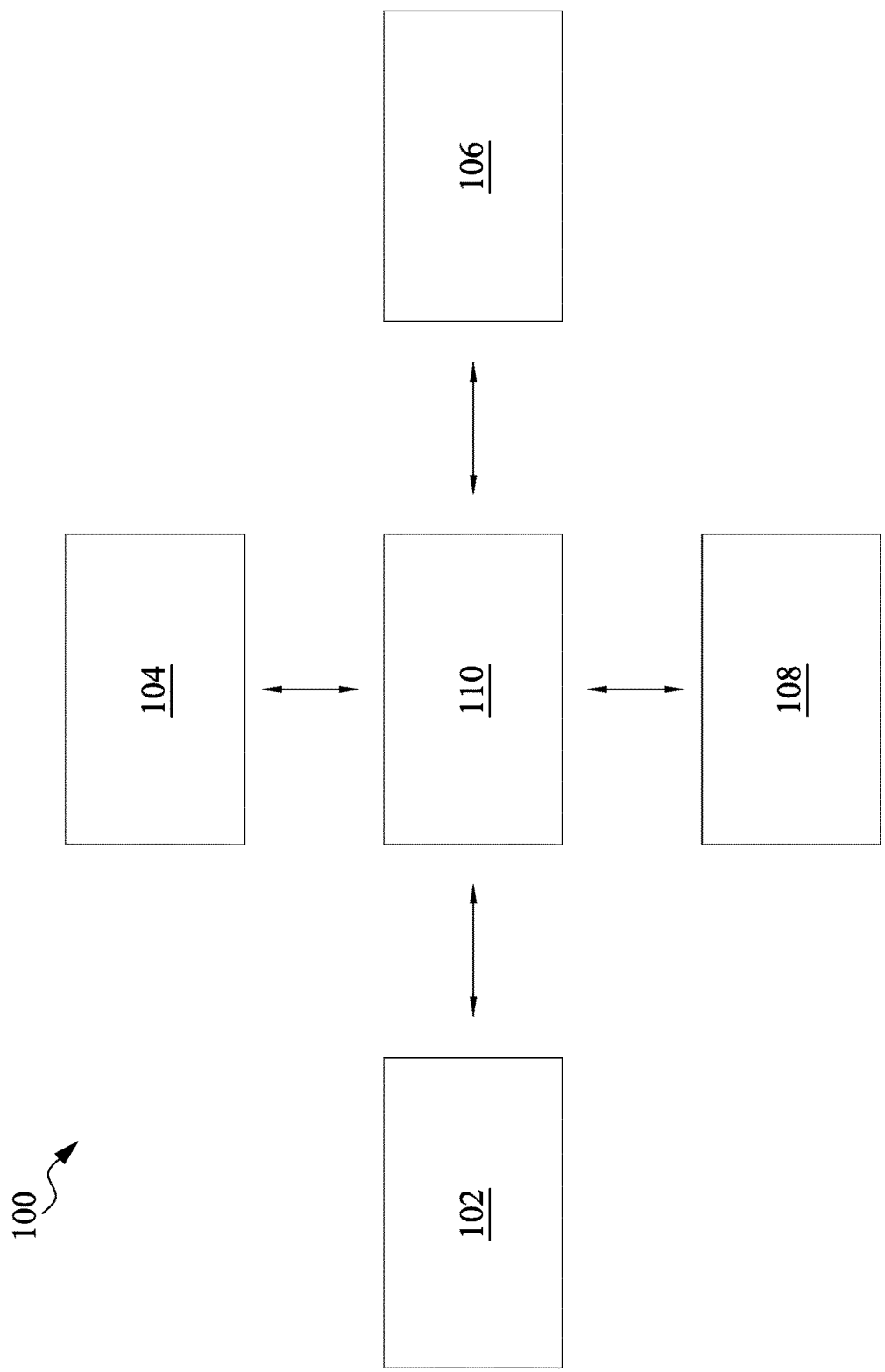
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wafer-on-wafer stacking or hybrid bonding (HB) is considered as a solution for performance improvement of complementary metal-oxide-semiconductor (CMOS) technology among other bonding technologies such as anodic, thermocompression, glass frit, adhesive, fusion, and surface activated bonding technologies. A CMOS integrated circuit (CIS) may include a first wafer (e.g., an application-specific integrated circuit (ASIC)) and a second wafer (e.g., a system on chip (SOC)). A seal-ring structure may be added to couple the first wafer and the second wafer at an interface. The seal-ring structure may improve reliability and/or reduce die-sawing stress and contaminants into the circuits of the CIS. However, seal-ring structures may fail (e.g., crack) based on an amount of stress applied to the seal-ring structures exceeding a tolerance of the seal-ring structures.

Some implementations described herein provide techniques and apparatuses for further improving reliability and/or for reducing die-sawing stress and contaminants released into the circuits of the CIS or another electronic device. For example, one or more semiconductor processing tools may dispose a metal (e.g., copper) bonding structure in an interface between a first wafer and a second wafer (e.g., as part of a seal-ring structure or independent from a seal-ring structure). In some implementations, the metal bonding structure may be disposed within (e.g., fully within, partially within, or in a same layer as) a substrate, dielectric structure, or other material of the first wafer and may extend to the interface or through the interface into the second wafer. In some implementations, the metal bonding structure may be disposed within a substrate, dielectric structure, or other material of the second wafer and may extend to the interface or through the interface into the first wafer. For example, the metal bonding structure may be disposed on (e.g., coupled to) a metal structure within the first wafer and/or a metal structure within the second wafer. In this way, the CIS may be supported at the interface by metal material that may reduce lateral shifting between the first wafer and the second wafer, which may reduce a likelihood of cracking between the first wafer and the second wafer.

Although this disclosure describes a CIS, the features and techniques described equally apply to other types of electronic devices, such as a logic device stacked with a memory device.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, a bonding tool 108, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The bonding tool 108 is a semiconductor processing tool that is capable of bonding two or more wafers (or two or more semiconductor substrates, or two or more semiconductor devices) together. For example, the bonding tool 108 may include a eutectic bonding tool that is capable of forming a eutectic bond between two or more wafers. In these examples, the bonding tool 108 may heat the two or more wafers to form a eutectic system between the materials of the two or more wafers.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
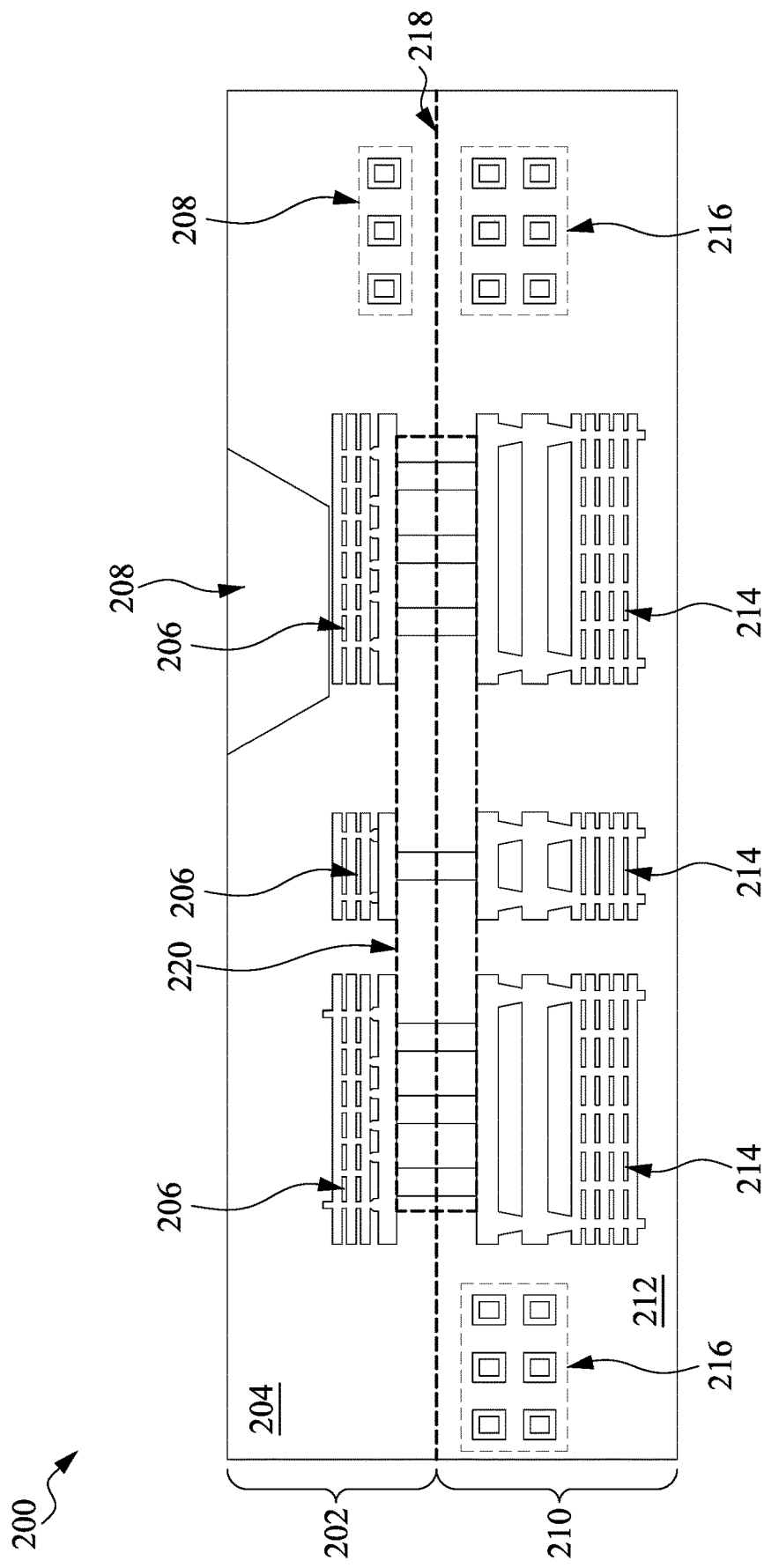
FIG. 2 is a diagram of an example semiconductor structure described herein.

FIG. 2 is a diagram of an example electronic device 200 described herein. FIG. 2 shows a first wafer bonded to a second wafer using hybrid bonding in which a metal bonding structure extends from a metal structure disposed within the first wafer to a metal structure disposed within the second wafer. In some implementations, the electronic device 200 includes one or more layers not shown in FIG. 2, such as one or more barrier layers, adhesion layers, metal gates, substrates, interconnects, recesses (e.g., vias), or semiconductor structures, among other examples. In some implementations, the electronic device 200 may include, or may be included within, a complementary metal-oxide-semiconductor (CMOS) image sensor (CIS), a 3-dimensional integrated circuit (IC), or a 3-dimensional resistive random access memory device (3D RRAM), among other examples.

As shown in FIG. 2, the electronic device 200 may include a first wafer 202 that includes a body 204. The body 204 may include one or more layers of materials, such as dielectric materials, polysilicon materials, and/or a substrate material. The dielectric materials may include one or more inter-metal dielectrics, one or more inter-layer dielectrics, or one or more dielectric bonding structures, among other dielectric semiconductor structures. For example, the dielectric materials may include a polymer layer, a silicon nitride layer, and/or a silicon dioxide layer (e.g., on a bottom surface of the body 204 to facilitate bonding), among other examples. The polysilicon materials may include, or may be included in, one or more semiconductor devices, such as a transistor (e.g., as a gate of the transistor). The substrate material may include a semiconductor die substrate, a semiconductor wafer, or another type of substrate in and/or on which semiconductor devices may be formed. In some implementations, the substrate material is formed of silicon (Si), a material including silicon, a III-V compound semiconductor material such as gallium arsenide (GaAs), a silicon on insulator (SOI), or another type of semiconductor material.

The first wafer 202 includes one or more metal structures 206 disposed within the body 204. The one or more metal structures 206 may include multiple layers of metal material and/or may be disposed within multiple layers of the body 204. For example, the one or more metal structures 206 may provide a lattice structure within the body 204. In some implementations, a metal structure 206 of the one or more metal structures 206 has a width (e.g., in a direction of layers of the first wafer 202, as shown in a left-right direction in FIG. 2) that is greater than a thickness of the one or more metal structures 206 (e.g., in a direction orthogonal to the direction of layers of the first wafer 202, as shown in an up-down direction in FIG. 2). Additionally, or alternatively, the width may extend in a direction that is parallel to the top surface of the body 204 of the first wafer 202. In some implementations, the one or more metal structures 206 are embedded within the body 204 at a depth (e.g., as measured from a bottom surface of the first wafer 202 in FIG. 2) that is less than the width of the one or more metal structures 206. In this way, the one or more metal structures 206 may provide an anchor for the first wafer 202 to which a metal bonding structure may be connected to provide structural support for the electronic device 200.

In some implementations, a first metal structure 206 of the one or more metal structures 206 is embedded at a first depth, has a first width, and has a first thickness and a second metal structure 206 of the one or more metal structures 206 is embedded at a second depth, has a second width, and has a second thickness with one or more of the second depth, the second width, and/or the second thickness being different from one or more of the first depth, the first width, and/or the first thickness, respectively. In some implementations, the one or more metal structures 206 include copper material, tungsten material, cobalt material, and/or ruthenium material, among other metal materials. In some implementations, the one or more metal structures 206 may be a component of a seal ring structure of the electronic device 200.

The first wafer 202 may also include one or more semiconductor structures 208, such as a deep trench structure, a shallow trench structure, a logic device, and/or a transistor structure, among other semiconductor structures. In some implementations, the one or more semiconductor structures 208 are insulated from the one or more metal structures 206 and/or provide insulation to the one or more metal structures 206. In this way, the one or more metal structures 206 may provide structural support to the electronic device 200 without increasing a likelihood of shorting between the one or more semiconductor structures 208.

As further shown in FIG. 2, the electronic device 200 may include a second wafer 210 that includes a body 212. The body 212 may include one or more layers of materials, such as dielectric materials, polysilicon materials, and/or a substrate material. The dielectric materials may include one or more inter-metal dielectrics, one or more inter-layer dielectrics, or one or more dielectric bonding structures, among other dielectric semiconductor structures. For example, the dielectric materials may include a polymer layer, a silicon nitride layer, and/or a silicon dioxide layer (e.g., on a top surface of the body 212 to facilitate bonding), among other examples. The polysilicon materials may include, or may be included in, one or more semiconductor devices, such as a transistor (e.g., as a gate of the transistor). The substrate material may include a semiconductor die substrate, a semiconductor wafer, or another type of substrate in and/or on which semiconductor devices may be formed. In some implementations, the substrate is formed of silicon, a material including silicon, a III-V compound semiconductor material such as gallium arsenide, a silicon on insulator, or another type of semiconductor material.

The second wafer 210 includes one or more metal structures 214 disposed within the body 212. The one or more metal structures 214 may include multiple layers of metal material and/or may be disposed within multiple layers of the body 212. For example, the one or more metal structures 214 may provide a lattice structure within the body 212. In some implementations, the one or more metal structures 214 may include a first quantity of layers of metal material that is different from a second quantity of layers of metal material of the one or more metal structures 214. In some implementations, a metal structure 214 of the one or more metal structures 214 has a width that is greater than a thickness of the one or more metal structures 206. Additionally, or alternatively, the width may extend in a direction that is parallel to the top surface of the body 212 of the second wafer 210. In some implementations, the one or more metal structures 214 are embedded within the body 212 at a depth (e.g., as measured from a top surface of the second wafer 210 in FIG. 2) that is less than the width of the one or more metal structures 214. In this way, the one or more metal structures 214 may provide an anchor for the second wafer 210 to which a metal bonding structure may be connected to provide structural support for the electronic device 200.

In some implementations, a first metal structure 214 of the one or more metal structures 214 is embedded at a third depth, has a third width, and has a third thickness and a second metal structure 214 of the one or more metal structures 214 is embedded at a fourth depth, has a fourth width, and has a fourth thickness with one or more of the fourth depth, the fourth width, and/or the fourth thickness being different from one or more of the third depth, the third width, and/or the third thickness, respectively. In some implementations, the one or more metal structures 214 may have depths, thicknesses, and/or widths that are different from depths, thicknesses and/or widths of the one or more metal structures 206. In some implementations, the one or more metal structures 214 include copper material, tungsten material, cobalt material, and/or ruthenium material, among other metal materials. In some implementations, the one or more metal structures 214 may be a component of a seal ring structure of the electronic device 200.

The second wafer 210 may also include one or more semiconductor structures 216, such as a deep trench structure, a shallow trench structure, a logic device, and/or a transistor structure, among other semiconductor structures. In some implementations, the one or more semiconductor structures 216 are insulated from the one or more metal structures 214 and/or provide insulation to the one or more metal structures 214. In this way, the one or more metal structures 214 may provide structural support to the electronic device 200 without increasing a likelihood of shorting between the one or more semiconductor structures 216.

In some implementations, the first wafer 202 and/or the second wafer 210 may include an SOC or an ASIC. For example, the first wafer 202 may include one of an SOC or an ASIC and the second wafer 210 may include the other of an SOC or an ASIC, both of the first wafer 202 and the second wafer 210 may include an SOC, or both of the first wafer 202 and the second wafer 210 may include an ASIC, among other configurations.

The first wafer 202 is bonded to the second wafer 210 at an interface 218. A metal bonding structure 220 is coupled to the first metal structure 206 and the second metal structure 214 and extends through the interface 218. The metal bonding structure 220 may include a copper-based material, a tungsten-based material, an aluminum-based material, or another metal material. In some implementations, the metal bonding structure 220 includes one or more elements that extend through the interface 218. The one or more elements may extend from the one or more metal structures 206 to the one or more metal structures 214 with an angle that is approximately 90 degrees. In this way, the one or more elements may provide improved structural support when compared to one or more elements disposed at an angle that is less than approximately 60 degrees. In some implementations, the one or more elements may include a first set of metal elements that extend from one or more metal structures 206 to the interface 218 and a second set of metal elements that extend from the one or more metal structures 214 to the interface 218, with one or more of the first set of metal elements being bonded to one or more of the second set of metal elements. In other words, some or all of the first set of metal elements may be bonded to some or all of the second set of metal elements at the interface 218. In this way, the first wafer 202 may be bonded to the second wafer 210 using a metal bond.

Based on the metal bonding structure 220 extending between the metal structure 206 within the body 204 of the first wafer 202 and the metal structure 214 within the body 212 of the second wafer 210, the electronic device 200 may reduce cracking at the interface 218 and/or may reduce stress at the interface 218.

In some implementations, one or more of the first set of metal elements may be aligned with corresponding one or more of the second set of metal elements (e.g., one or more of the second set of metal elements to which the one or more of the first set of metal elements are bonded). In other words, a bonded pair including one of the first set of metal elements and one of the second set of metal elements may be aligned with a same logical axis (e.g., may extend along, and be centered on, the same logical axis). Additionally, or alternatively, the one of the first set of metal elements and the one of the second set of metal elements may be approximately equal in length (e.g., from one of the metal structures 206 or 214 to the interface 218) and/or in width (e.g., along a layer of one of the body 204 or the body 212) and/or may have an approximately equal shape.

In some implementations, a surface of the body 204 of the first wafer 202 at the interface 218 and a surface of the body 212 of the second wafer 210 at the interface 218 may be bonded using one or more adhesion layers of the body 204 and/or the body 212 at the interface 218. In some implementations, the body 204 may include a structure of multiple dielectric materials that includes a polymer layer, a silicon nitride layer, and/or a silicon dioxide layer, among other example dielectric materials. For example, the structure of multiple dielectric materials may include the silicon dioxide layer at the interface 218 based on the silicon dioxide layer being configured to adhere to the body 212 (e.g., a silicon dioxide layer of the body 212 at the interface 218) using heat bonding. In this way, the first wafer 202 may be bonded to the second wafer 210 using a hybrid bond that includes a metal bond between the first set of metal elements and the second set of metal elements of the metal bonding structure 220 and a dielectric bond between the body 204 and the body 212 (e.g., using heat bonding). In some implementations, the first wafer 202 may be bonded to the second wafer 210 using a hybrid bond that may be formed at a temperature in a range of approximately 100 degrees Celsius to approximately 300 degrees Celsius. This may conserve energy used to form the hybrid bond when compared with other bonding techniques, which may require temperatures above 300 degrees Celsius.

Based on having a hybrid bond between the first wafer 202 and the second wafer 210 at the interface 218 and based on the metal bonding structure 220 extending between the metal structure 206 within the body 204 of the first wafer 202 and the metal structure 214 within the body 212 of the second wafer 210, the electronic device 200 may further reduce cracking at the interface 218 and/or may further reduce stress at the interface 218.

As indicated above, FIG. 2 is provided as an example. Other examples may differ from what is described with regard to FIG. 2.

Figure 3A:
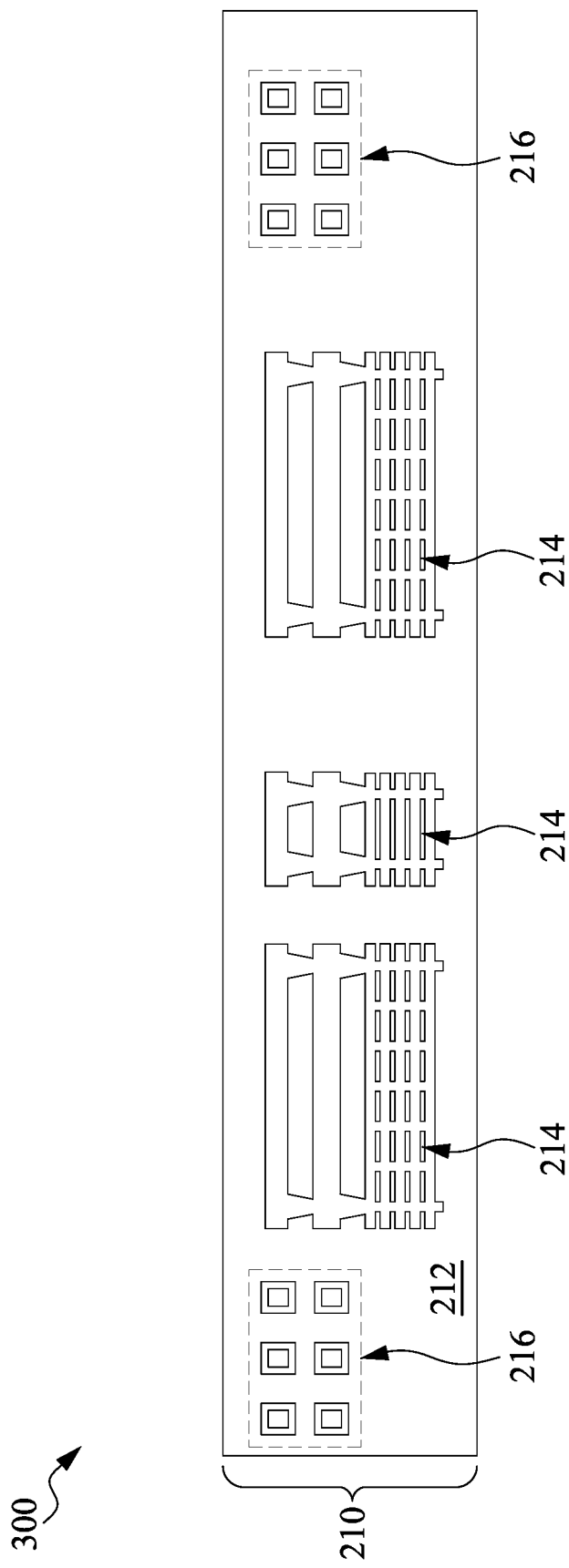
FIGS. 3A-3C are diagrams of an example implementation described herein.
Figure 3B:
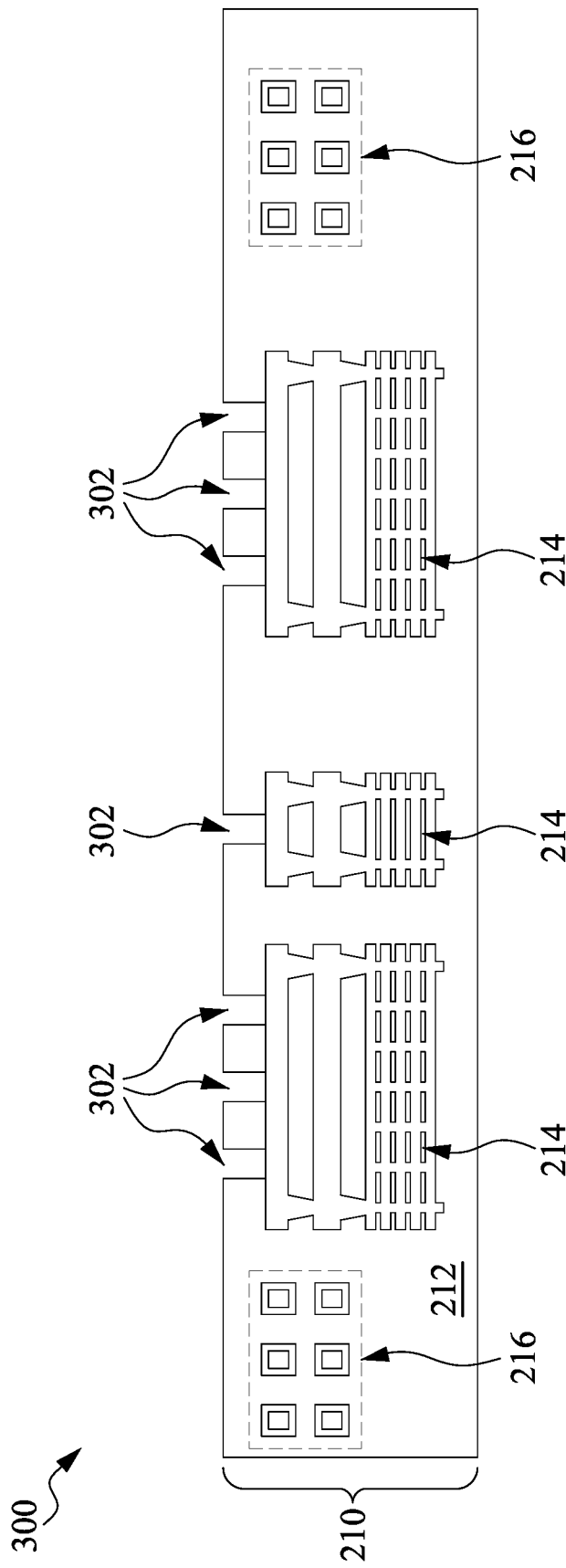
Figure 3C:
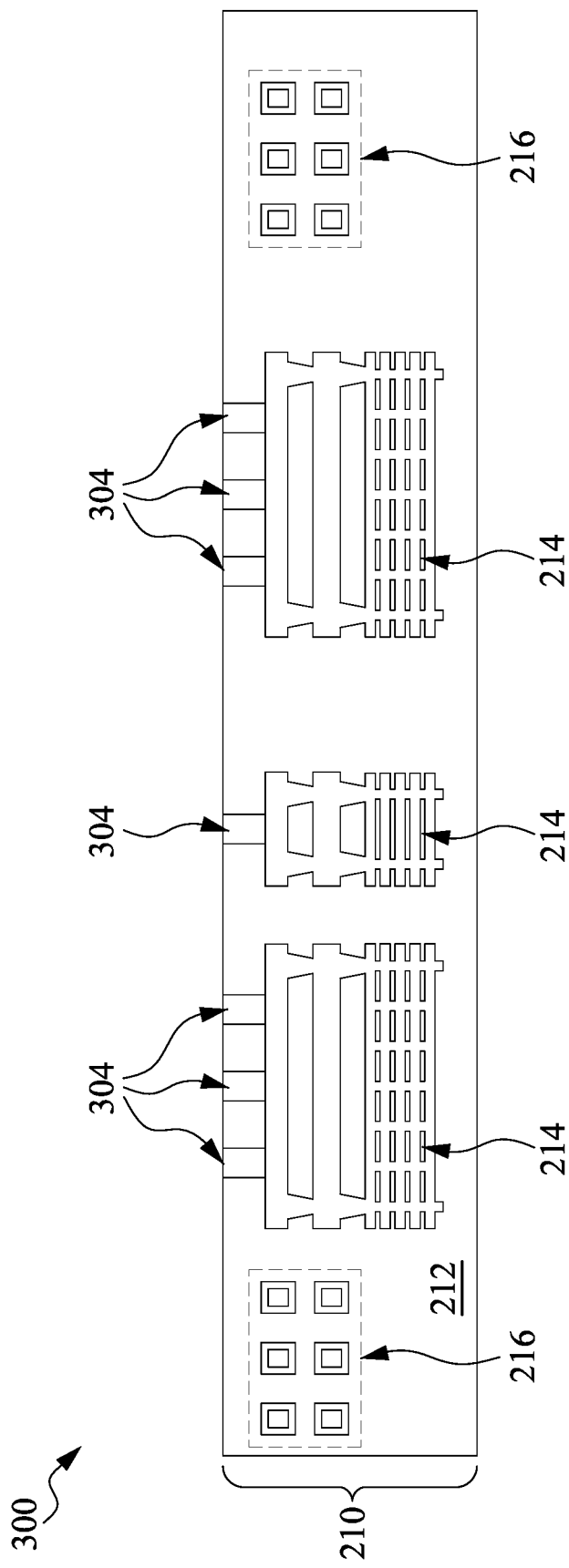

FIGS. 3A-3C are diagrams of an example implementation 300 described herein. Example implementation 300 may be an example process for forming the second wafer 210 of the electronic device 200. In some implementations, the wafer includes an ASIC or an SOC. The second wafer 210 may include one or more additional devices, structures, and/or layers not shown in FIGS. 3A-3C.

As shown in FIG. 3A, example implementation 300 may include forming one or more metal structures 214 and/or one or more semiconductor structures 216 within a body 212 of the second wafer 210. In some implementations, a deposition tool (e.g., deposition tool 102) deposits materials of the one or more metal structures 214 and/or materials of the one or more semiconductor structures 216 within the body 212 of the second wafer 210. For example, the deposition tool may deposit the materials of the one or more metal structures 214 and/or the materials of the one or more semiconductor structures 216 within recessed portions (e.g., formed based on an etching operation of an etching tool) of the body 212 of the second wafer 210. In some implementations, the deposition tool uses chemical vapor deposition or physical vapor deposition, among other examples, to deposit the materials of the one or more metal structures 214 and/or the materials of the one or more semiconductor structures 216 within recessed portions of the body 212 of the second wafer 210. In some implementations, the deposition tool may deposit one or more layers of the body 212 of the second wafer 210 on and/or between elements of the one or more metal structures 214 and/or the one or more semiconductor structures 216. For example, the deposition tool may deposit one or more dielectric layers on a top surface of the one or more metal structures 214.

In some implementations, a planarization tool (e.g., planarization tool 106) may polish and/or planarize the body 212 of the second wafer 210 (e.g., after forming the one or more metal structures 214 and/or after depositing one or more layers of the body 212) to form a generally planar top surface of the second wafer 210. In this way, the top surface of the second wafer 210 (e.g., the body 212) may be suitable for bonding to the first wafer 202.

As shown in FIG. 3B, example implementation 300 may include forming a set of recessed portions 302 in a top surface of the body 212 of the second wafer 210. In some implementations, an etching tool (e.g., etching tool 104) may etch one or more portions of the top surface of the body 212 of the second wafer 210 to form the set of recessed portions 302. In some implementations, the etching tool forms the set of recessed portions 302 to extend from the top surface of the body 212 of the second wafer 210 to the one or more metal structures 214.

As shown in FIG. 3C, example implementation 300 may include depositing a set of metal elements 304 within the set of recessed portions 302 of the second wafer 210. In some implementations, a deposition tool (e.g., deposition tool 102) deposits material of the set of metal elements 304 within the set of recessed portions 302. In some implementations, the deposition tool uses chemical vapor deposition, physical vapor deposition, and/or reflow, among other examples, to deposit the material of the set of metal elements 304 within the set of recessed portions 302 of the second wafer 210. In some implementations, the deposition tool deposits the set of metal elements 304 in multiple layers. For example, the deposition tool may deposit one or more seed layers (e.g., 3 seed layers) in a process for depositing the set of metal elements 304. In some implementations, the deposition tool may deposit one or more barrier layers and/or adhesion layers within the set of recessed portions 302 of the second wafer 210 to reduce electromigration of the set of metal elements 304 into the body 212 and/or to reduce peeling of the set of metal elements 304 from the body 212 and/or from the one or more metal structures 214.

As indicated above, FIGS. 3A-3C are provided as an example. Other examples may differ from what is described with regard to FIGS. 3A-3C.

Figure 4A:
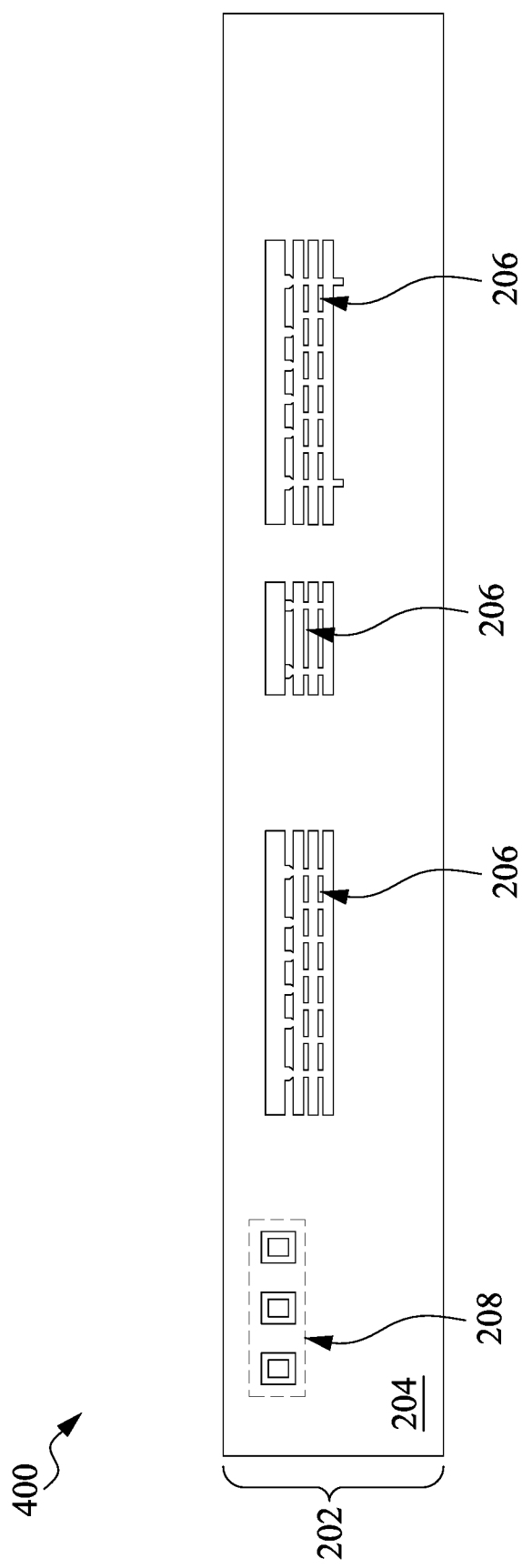
FIGS. 4A-4C are diagrams of an example implementation described herein.
Figure 4B:
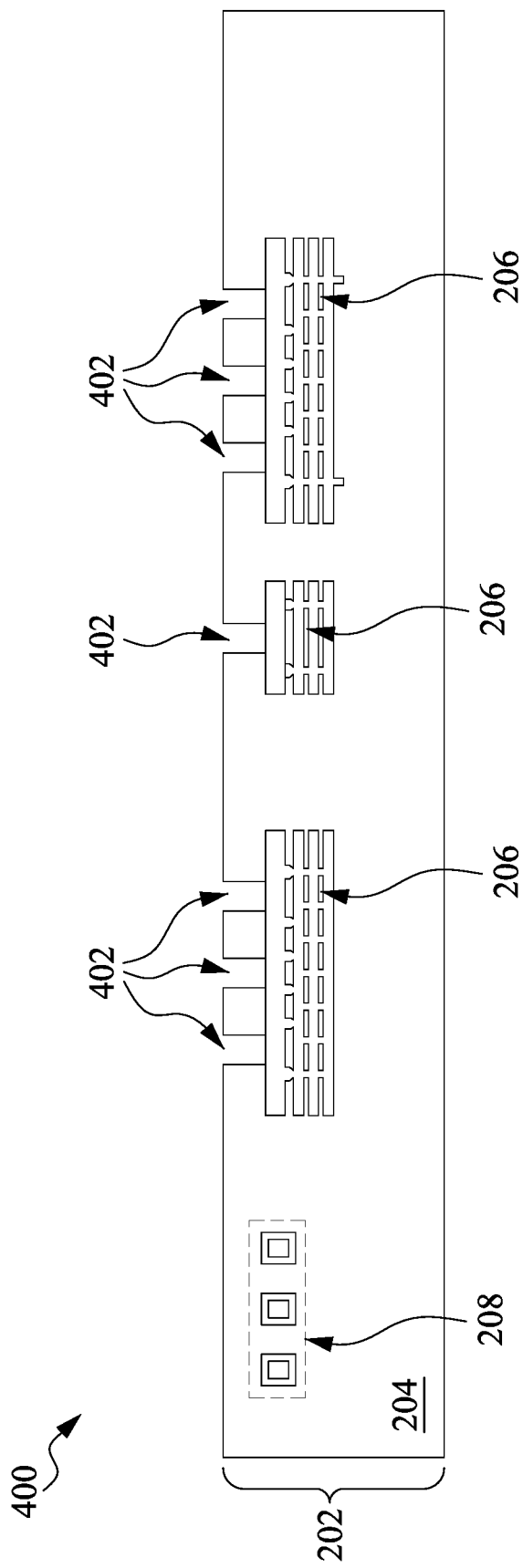
Figure 4C:
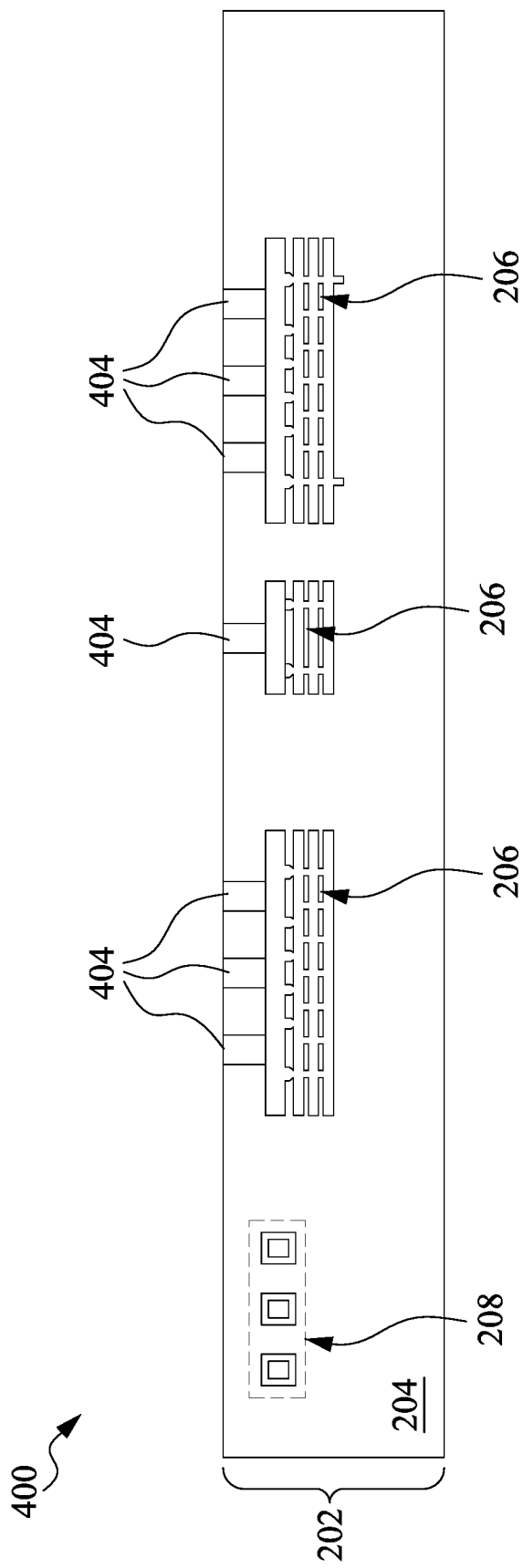

FIGS. 4A-4C are diagrams of an example implementation 400 described herein. Example implementation 400 may be an example process for forming the first wafer 202 of the electronic device 200. In some implementations, the wafer includes an SOC or an ASIC. The first wafer 202 may include one or more additional devices, structures, and/or layers not shown in FIGS. 4A-4C.

As shown in FIG. 4A, example implementation 400 may include forming one or more metal structures 206 and/or one or more semiconductor structures 208 within a body 204 of the first wafer 202. In some implementations, a deposition tool (e.g., deposition tool 102) deposits materials of the one or more metal structures 206 and/or materials of the one or more semiconductor structures 208 within the body 204 of the first wafer 202. For example, the deposition tool may deposit the materials of the one or more metal structures 206 and/or the materials of the one or more semiconductor structures 208 within recessed portions (e.g., formed based on an etching operation of an etching tool) of the body 204 of the first wafer 202. In some implementations, the deposition tool uses chemical vapor deposition or physical vapor deposition, among other examples, to deposit the materials of the one or more metal structures 206 and/or the materials of the one or more semiconductor structures 208 within recessed portions of the body 204 of the first wafer 202. In some implementations, the deposition tool may deposit one or more layers of the body 204 of the first wafer 202 on, and/or or between, elements of the one or more metal structures 206 and/or the one or more semiconductor structures 208. For example, the deposition tool may deposit one or more dielectric layers on a top surface of the one or more metal structures 206.

In some implementations, a planarization tool (e.g., planarization tool 106) polishes and/or planarizes the body 204 of the first wafer 202 (e.g., after forming the one or more metal structures 206 and/or after depositing one or more layers of the body 204) to form a generally planar top surface of the first wafer 202. In this way, the top surface of the first wafer 202 (e.g., the body 204) may be suitable for bonding to the second wafer 210.

As shown in FIG. 4B, example implementation 400 may include forming a set of recessed portions 402 in a top surface of the body 204 of the first wafer 202. In some implementations, an etching tool (e.g., etching tool 104) etch one or more portions of the top surface of the body 204 of the first wafer 202 to form the set of recessed portions 402. In some implementations, the etching tool forms the set of recessed portions 402 to extend from the top surface of the body 204 of the first wafer 202 to the one or more metal structures 206.

As shown in FIG. 4C, example implementation 400 may include depositing a set of metal elements 404 within the set of recessed portions 402 of first wafer 202. In some implementations, a deposition tool (e.g., deposition tool 102) deposits material of the set of metal elements 404 within the set of recessed portions 402. In some implementations, the deposition tool uses chemical vapor deposition, physical vapor deposition, and/or reflow, among other examples, to deposit the material of the set of metal elements 404 within the set of recessed portions 402 of the first wafer 202. In some implementations, the deposition tool deposits the set of metal elements 404 in multiple layers. For example, the deposition tool may deposit one or more seed layers (e.g., 3 seed layers) in a process for depositing the set of metal elements 404. In some implementations, the deposition tool may deposit one or more barrier layers and/or adhesion layers within the set of recessed portions 402 of the first wafer 202 to reduce electromigration of the set of metal elements 404 into the body 204 and/or to reduce peeling of the set of metal elements 404 from the body 204 and/or from the one or more metal structures 206.

In some implementations, the set of metal elements 404 may for formed of a same material as the set of metal elements 304 (shown in FIG. 3C). For example, the set of metal elements 404 and the set of metal elements 304 may be formed of a copper-based material, a tungsten-based material, or a titanium-based material, among other examples.

As indicated above, FIGS. 4A-4C are provided as an example. Other examples may differ from what is described with regard to FIGS. 4A-4C. In some implementations, example implementation 400 may be a same process as example implementation 300. In some implementations, example implementation 400 may differ from example 300 based on differences between the one or more metal structures 206 and the one or more metal structures 214. Additionally, or alternatively, example implementation 400 may include forming an ASIC on the first wafer 202 and example implementation 300 may include forming an SOC on the second wafer 210, or vice versa.

Figure 5A:
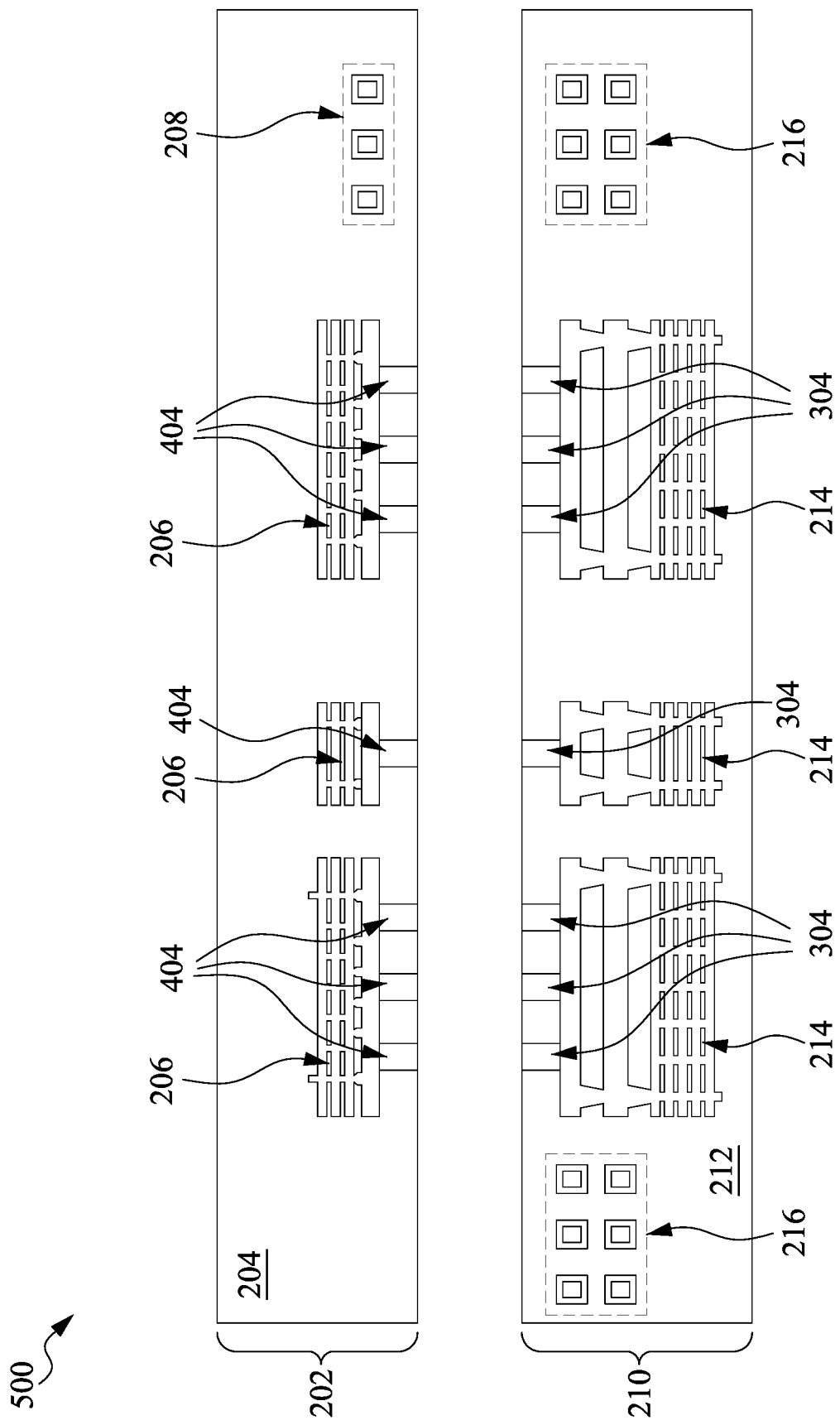
FIGS. 5A-5C are diagrams of an example implementation described herein.
Figure 5B:
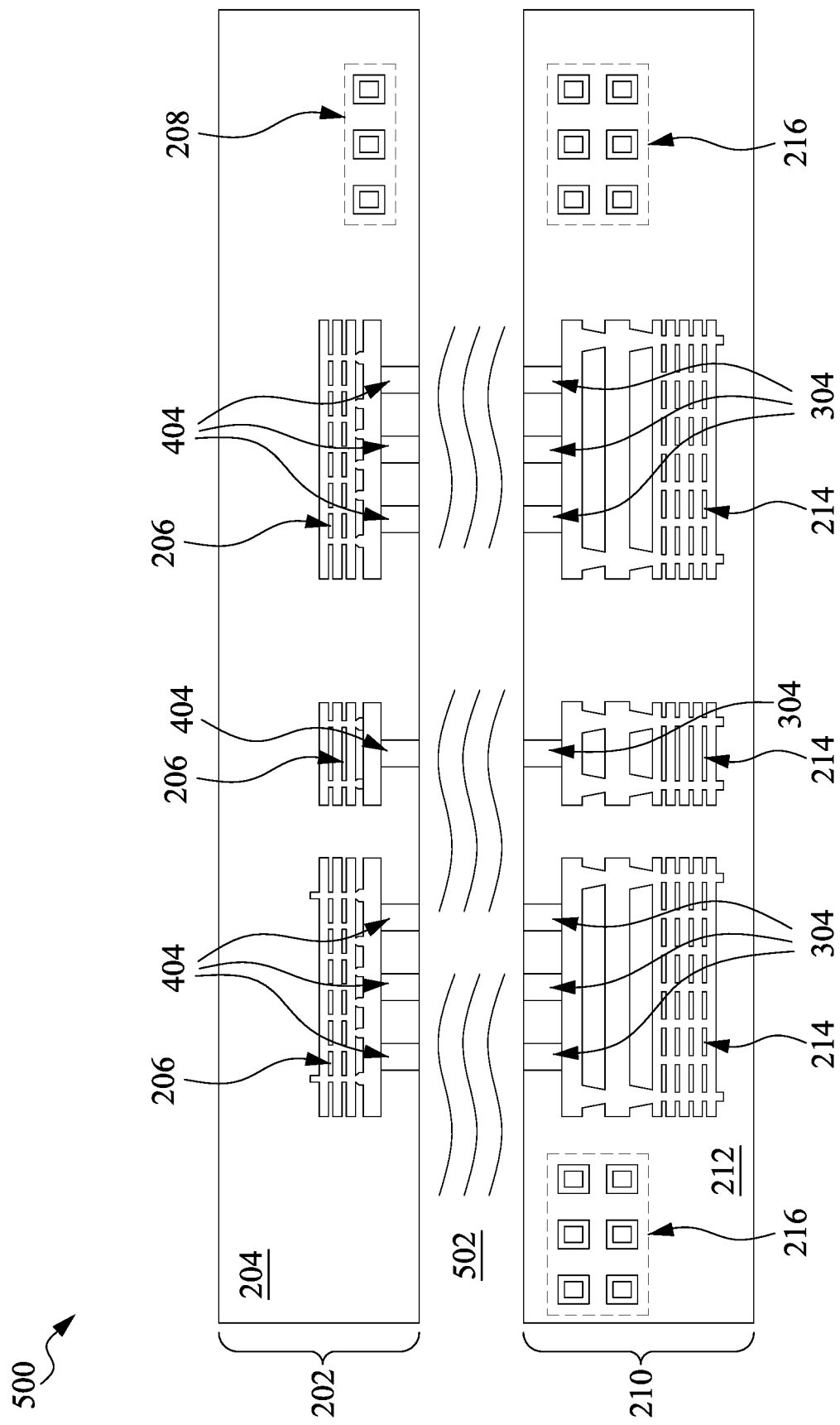
Figure 5C:
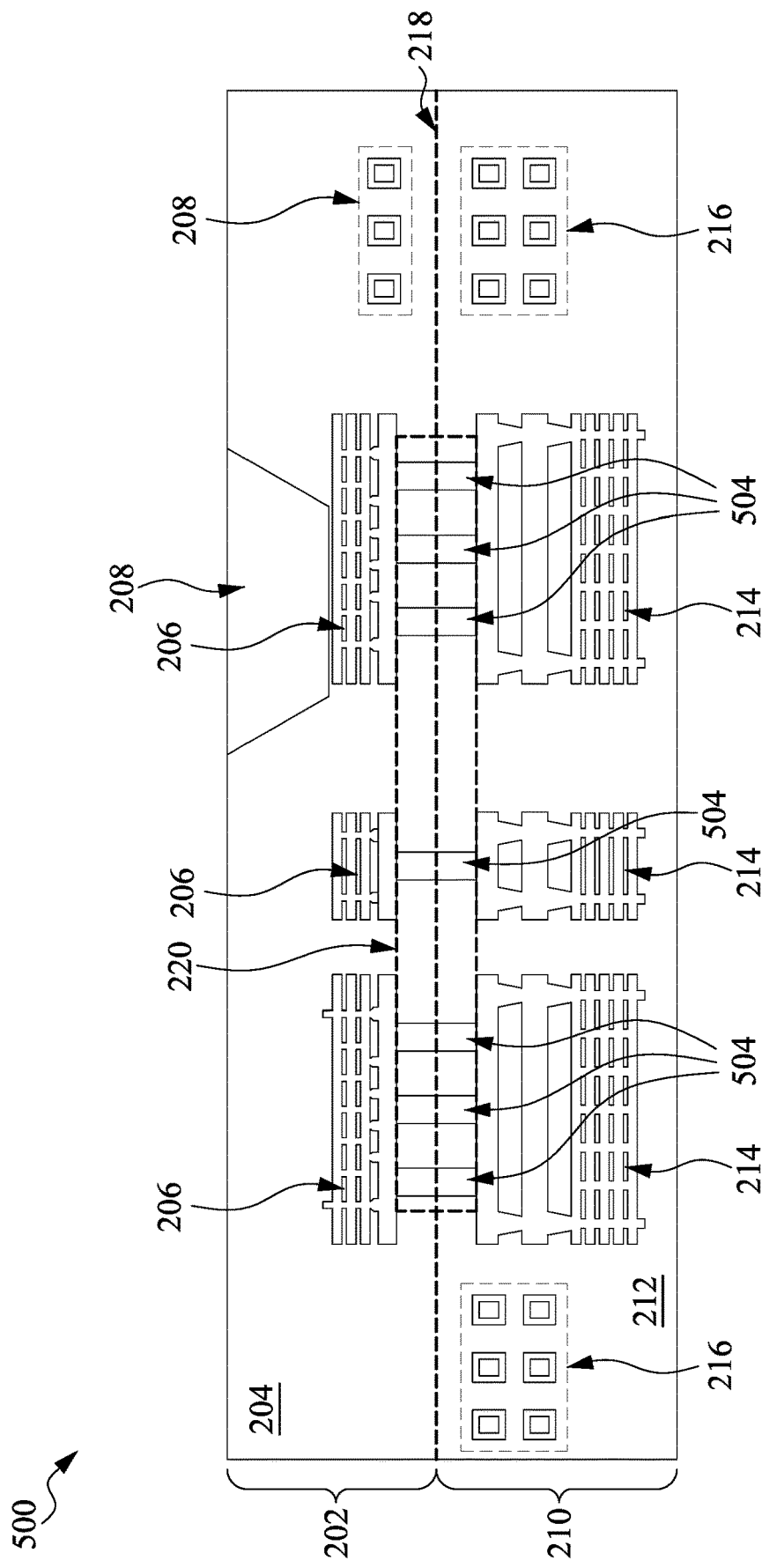

FIGS. 5A-5C are diagrams of an example implementation 500 described herein. Example implementation 500 may be an example process for bonding the first wafer 202 to the second wafer 210 to form the electronic device 200. In some implementations, the first wafer 202 and/or the second wafer 210 includes an SOC. Additionally, or alternatively, the first wafer 202 and/or the second wafer 210 includes an ASIC. The first wafer 202 and/or the second wafer 210 may include one or more additional devices, structures, and/or layers not shown in FIGS. 5A-5C.

As shown in FIG. 5A, the first wafer 202 is flipped such that a surface shown as a top surface of the first wafer 202 in FIGS. 4A-4C is now shown as a bottom surface of the first wafer 202 in FIG. 5A. In some implementations, a wafer/die transport tool (e.g., wafer/die transport tool 110) flips the first wafer 202. The wafer/die transport tool may position the set of metal elements 404 to be proximate to, aligned with, and/or in contact with the set of metal elements 304. Alternatively, the wafer/die transport tool may flip the second wafer 210 to position the set of metal elements 404 to be proximate to, aligned with, and/or in contact with the set of metal elements 304.

As shown in FIG. 5B, heat 502 may be applied to the bottom surface of the first wafer 202 and/or to the top surface of the second wafer 210. In some implementations, a bonding tool (e.g., bonding tool 108) applies heat 502 to the bottom surface of the first wafer 202 and/or to the top surface of the second wafer 210. The bonding tool may apply the heat 502 at a temperature within a range of approximately 100 degrees Celsius to approximately 300 degrees Celsius. For example, the temperature may be associated with a melting temperature of the material of the set of metal elements 304 and/or the set of metal elements 404. In this way, a bonding layer (e.g., of oxide-based material) of the first wafer 202 may bond with a bonding layer of the second wafer 210. Additionally, or alternatively, the set of metal elements 304 may form a bond (e.g., a covalent bond) with the set of metal elements 404 with a lower amount of heat 502 than a bond that is formed using only bonding layers of the dielectric materials. This may conserve energy resources associated with manufacturing an electronic device (e.g., electronic device 200) that includes the first wafer 202 and the second wafer 210).

As shown in FIG. 5C, the first wafer 202 may bond to the second wafer 210 based on the bottom surface of the first wafer 202 contacting the top surface of the second wafer 210. For example, the first wafer 202 may bond to the second wafer 210 based on heat and/or pressure applied to the bottom surface of the first wafer 202 and the top surface of the second wafer 210. In some implementations, a bonding tool (e.g., bonding tool 108) and/or a wafer/die transport tool (e.g., wafer/die transport tool 110) may position the first wafer 202 into contact with the second wafer 210.

As shown in FIG. 5C, the set of metal elements 304 and the set of metal elements 404 may bond together to form a metal bonding structure 220. The metal bonding structure 220 includes one or more metal elements 504 that extend from the one or more metal structures 206 to the one or more metal structures 214 through an interface 218 (e.g., a bonding interface). Based on the one or more metal elements 504 extending between, and coupling, the one or more metal structure 206 and the one or more metal structures 214, a bond between the first wafer 202 and the second wafer 210 may be improved. For example, the bond may cause a reduced lateral shifting between the first wafer 202 and the second wafer 210, which may reduce a likelihood of cracking between the first wafer 202 and the second wafer 210.

As indicated above, FIGS. 5A-5C are provided as an example. Other examples may differ from what is described with regard to FIGS. 5A-5C.

FIGS. 6A-6I are diagrams of example semiconductor structures 200 described herein. The example semiconductor structures 200 may include alternatives to the set of metal elements 304, the set of metal elements 404, the one or more metal elements 504 and/or the metal bonding structure 220 shown in any of FIGS. 2-5C. The described alternatives may be included in a wafer described herein (e.g., the first wafer 202 and/or the second wafer 210) and may replace, or may be in addition to, corresponding elements described in connection with FIGS. 2-5C. The example semiconductor structures 200 shown in FIGS. 6A-6I may include a hybrid bonding region 602 in which the set of metal elements 304, the set of metal elements 404, the one or more metal elements 504, and/or the metal bonding structure 220 bond and in which dielectric materials of the body 204 bond with dielectric materials of the body 212. The alternatives may simplify a manufacturing process by accounting for different shapes and non-aligned metal elements to bond the first wafer 202 to the second wafer 210.

Figure 6A:
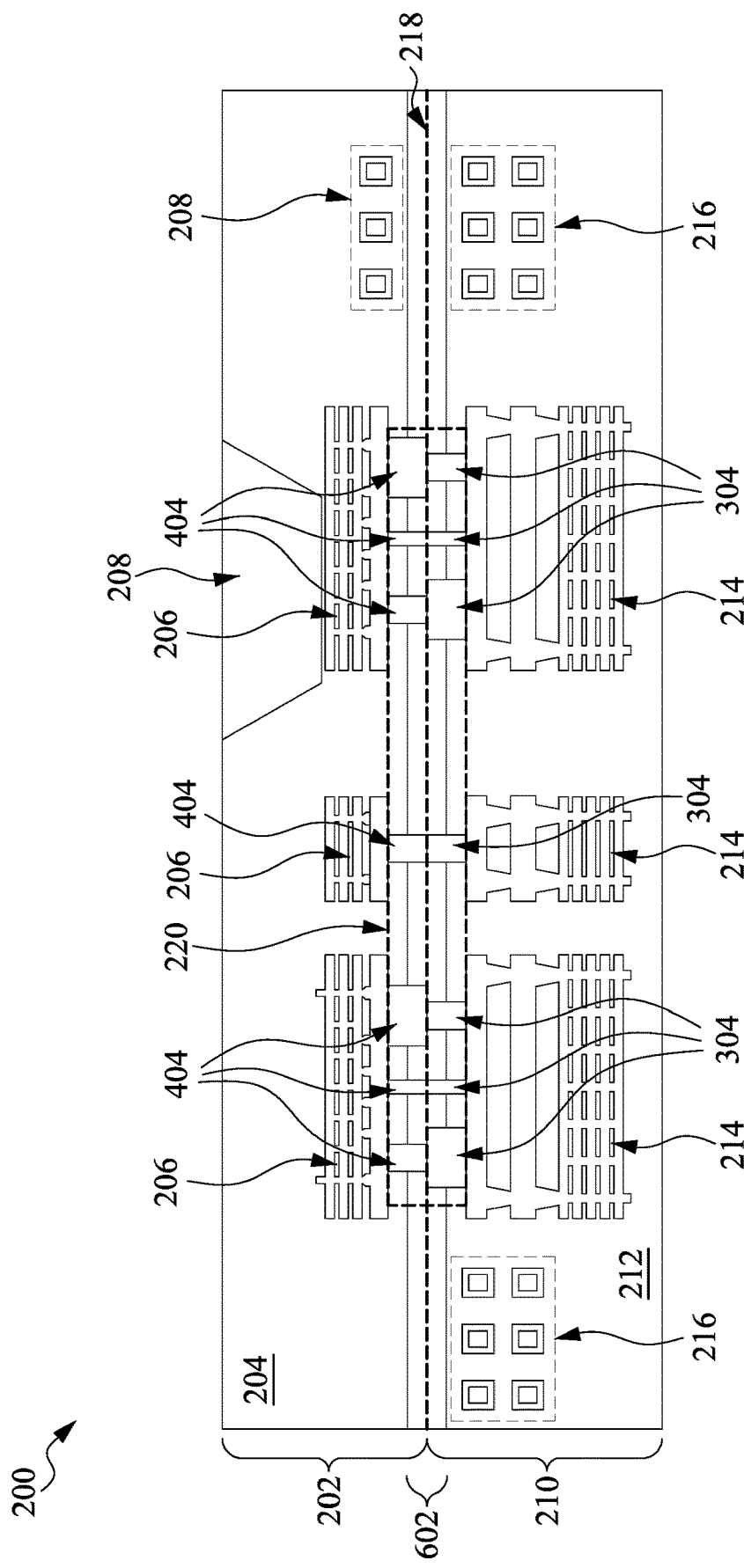
FIGS. 6A-6I are diagrams of example semiconductor structures described herein.

As shown in FIG. 6A, one or more of the set of metal elements 404 may have different widths from one or more others of the set of metal elements 404. Similarly, one or more of the set of metal elements 304 may have different widths from one or more others of the set of metal elements 304. As shown in FIG. 6A, pairs of bonded elements of the set of metal elements 304 and the set of metal elements 404 may have unequal widths. In some implementations, a first metal element 404 of the set of metal elements 404 is bonded to a second metal element 304 of the set of metal elements 304, with the first metal element 404 having a first width and the second metal element 304 having a second width that is greater than the first width. In some implementations, a third metal element 404, of the set of metal elements 404, may be bonded to a fourth metal element 304 of the set of metal elements 304, with the third metal element 404 having a third width and the fourth metal element 304 having a fourth width that is smaller than the third width.

Figure 6B:
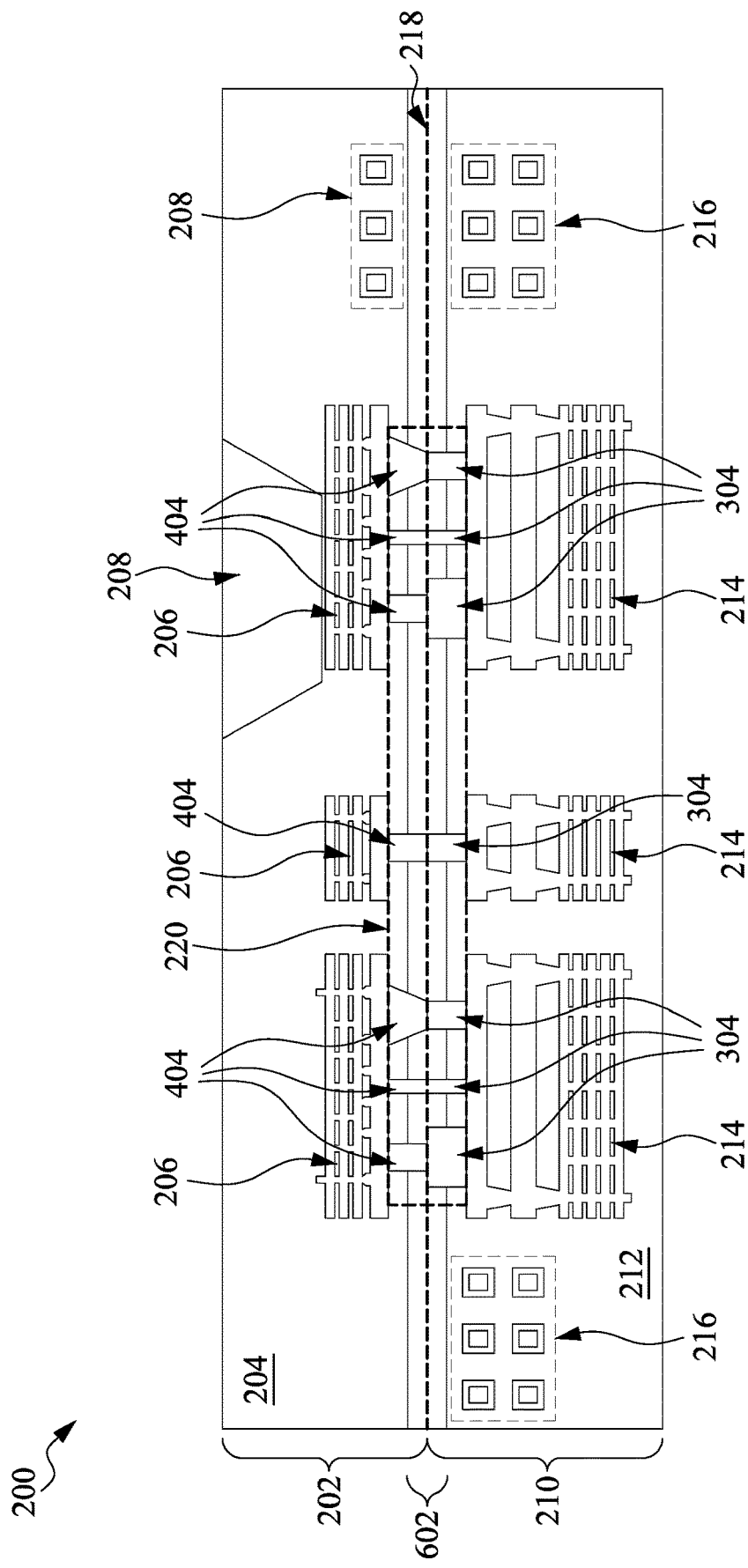

As shown in FIG. 6B, one or more of the set of metal elements 404 and/or one or more of the set of metal elements 304 may have a sloped side-surface. For example, the one or more of the set of metal elements 404 and/or the one or more of the set of metal elements 304 may have a trapezoidal-shaped cross-section. In some implementations, the one or more of the set of metal elements 404 and/or the one or more of the set of metal elements 304 have a first width at a first end coupled to a first metal structure 214 of the one or more metal structures 214 or a second metal structure 206 of the one or more metal structures 206, and a second width at a second end disposed at the interface 218. In some implementations, the first width is greater than the second width. Alternatively, the first width may be less than the second width.

As also shown in FIG. 6B, one or more of the set of metal elements 404 may have different shapes from one or more others of the set of metal elements 404. Similarly, one or more of the set of metal elements 304 may have different shapes from one or more others of the set of metal elements 304. In some implementations, pairs of bonded elements of the set of metal elements 304 and the set of metal elements 404 may have different shapes. In some implementations, a first metal element 404 of the set of metal elements 404 is bonded to a second metal element 304 of the set of metal elements 304, with the first metal element 404 having a first shape and the second metal element 304 having a second shape that is different from the first shape.

Figure 6C:
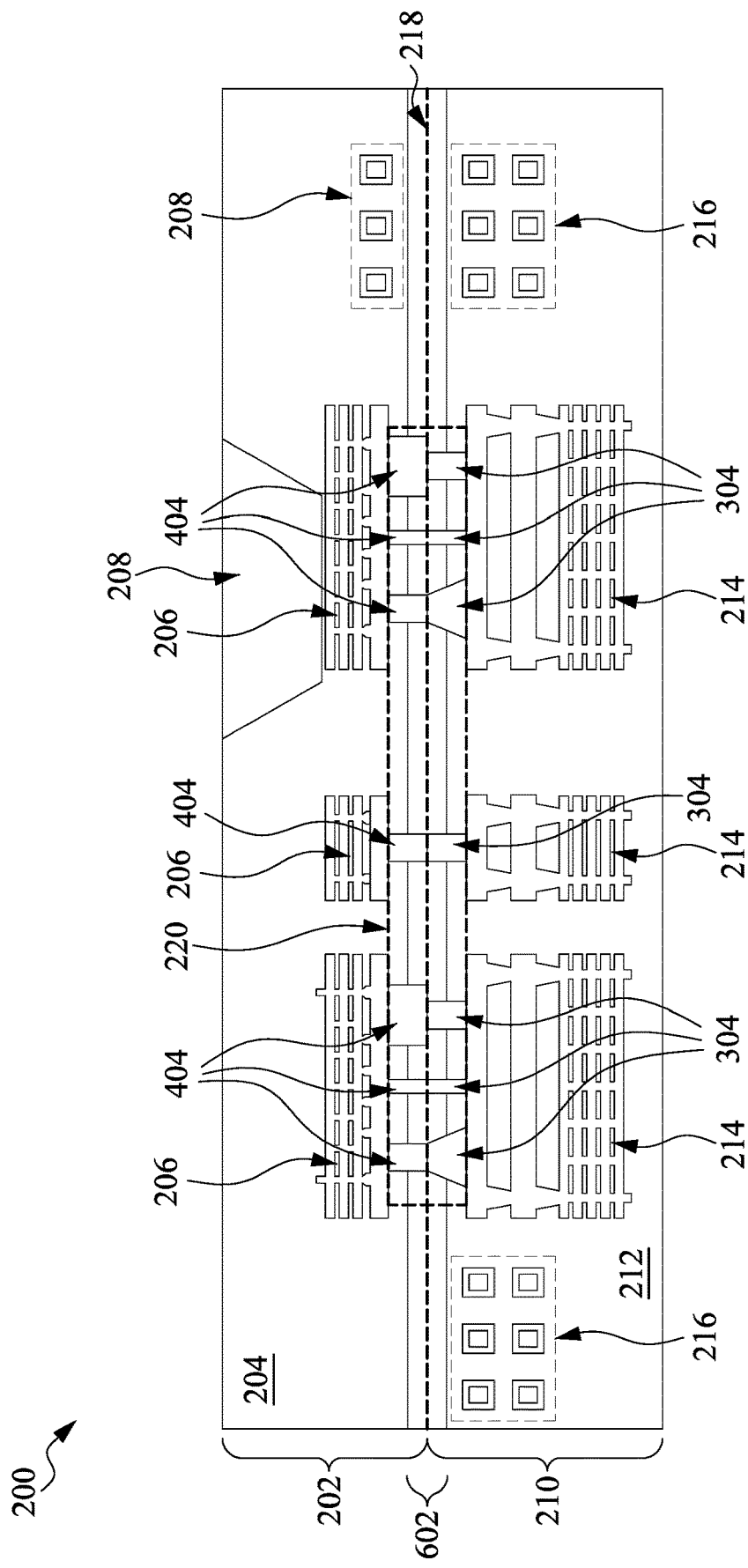

As also shown in FIG. 6C, the set of metal elements 404 may have metal elements having different shapes and/or different widths from one or more others of the set of metal elements 404. Similarly, the set of metal elements 304 may have metal elements having different shapes and/or different widths from one or more others of the set of metal elements 304. In some implementations, pairs of bonded elements of the set of metal elements 304 and the set of metal elements 404 may have different shapes and/or widths.

Figure 6D:
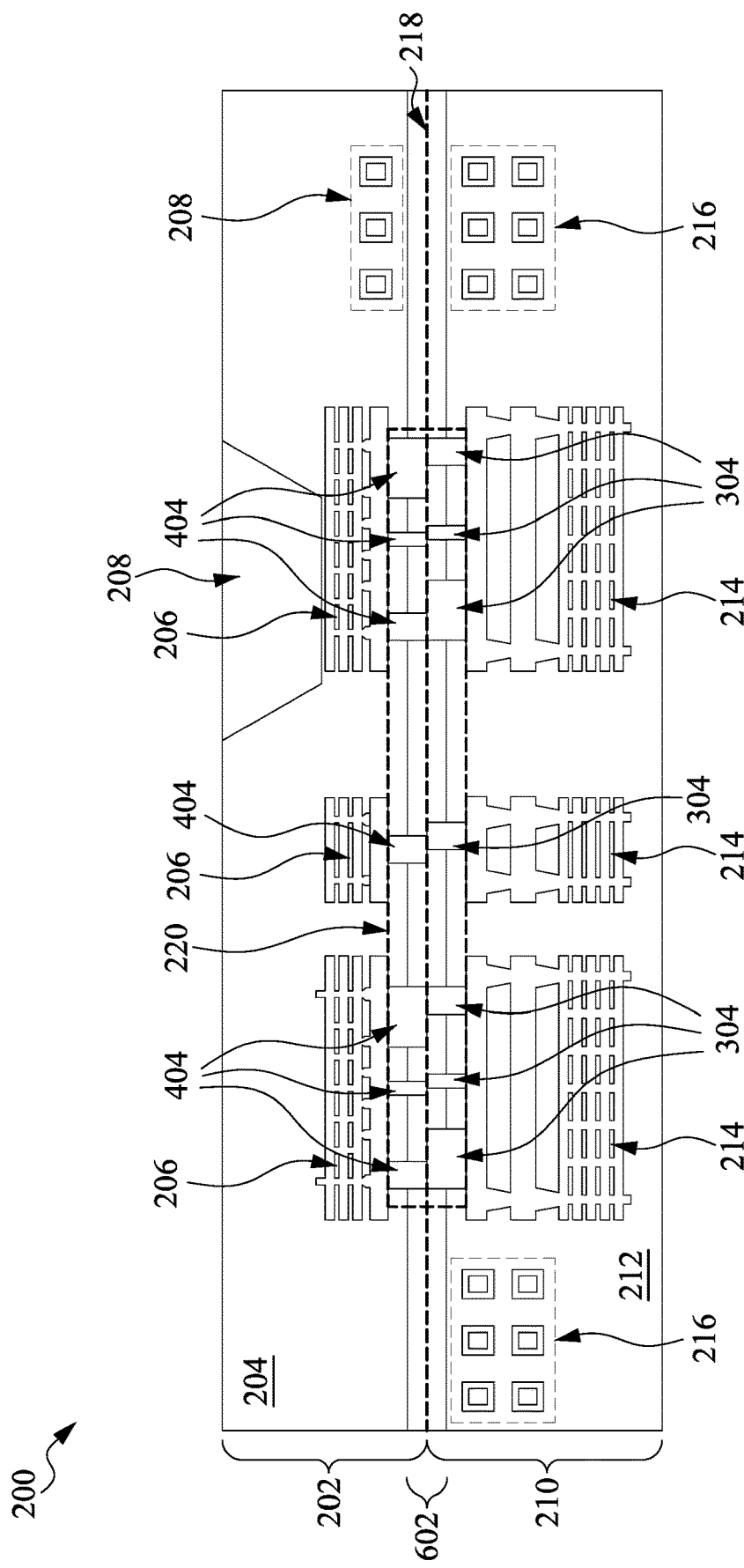
Figure 6E:
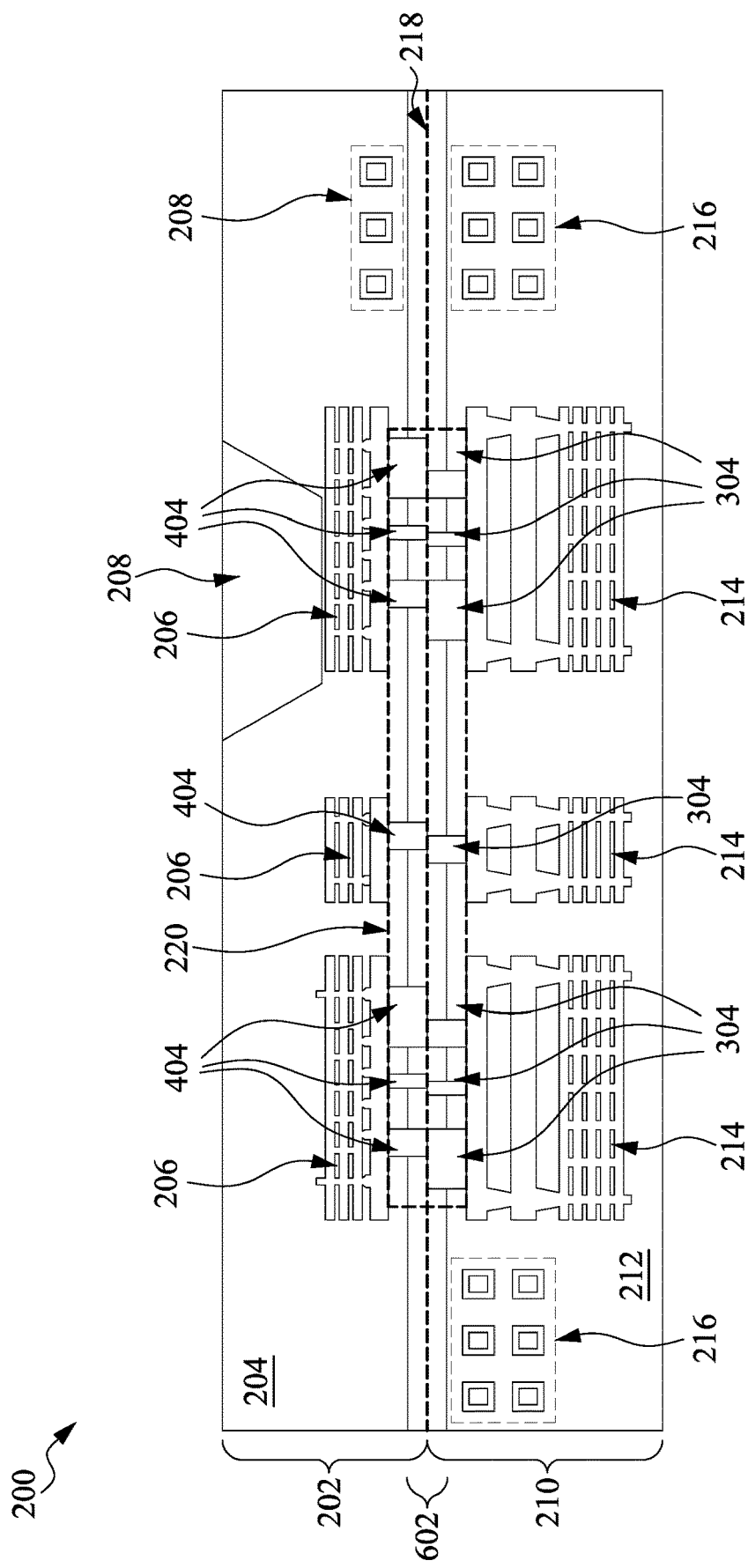

As shown in FIGS. 6D and 6E, pairs of bonded elements of the set of metal elements 304 and the set of metal elements 404 may not be aligned along a same logical axis (e.g., a logical axis that is orthogonal to the interface 218). For example, a first metal element 404, of the set of metal elements 404, may be bonded to a second metal element 304 of the set of metal elements 304, with the first metal element 404 extending along, and being centered on, a first logical axis from the first metal structure 206 to the interface 218. The second metal element 304 may extend along, and be centered on, a second logical axis from the second metal structure 214 to the interface 218, where the first logical axis is laterally displaced from the second logical axis. As shown in FIG. 6D, the set of metal elements 404 may extend along, and may be centered on, a first set of logical axes and the set of metal elements 304 may extend along, and may be centered on, a second set of logical axes that are laterally displaced from the first set of logical axes with a shift to the left side of FIG. 6D. Alternatively, as shown in FIG. 6E, the set of metal elements 404 may extend along, and may be centered on, a first set of logical axes and the set of metal elements 304 may extend along, and may be centered on, a second set of logical axes that are laterally displaced from the first set of logical axes with a shift to the right side of FIG. 6E.

Figure 6F:
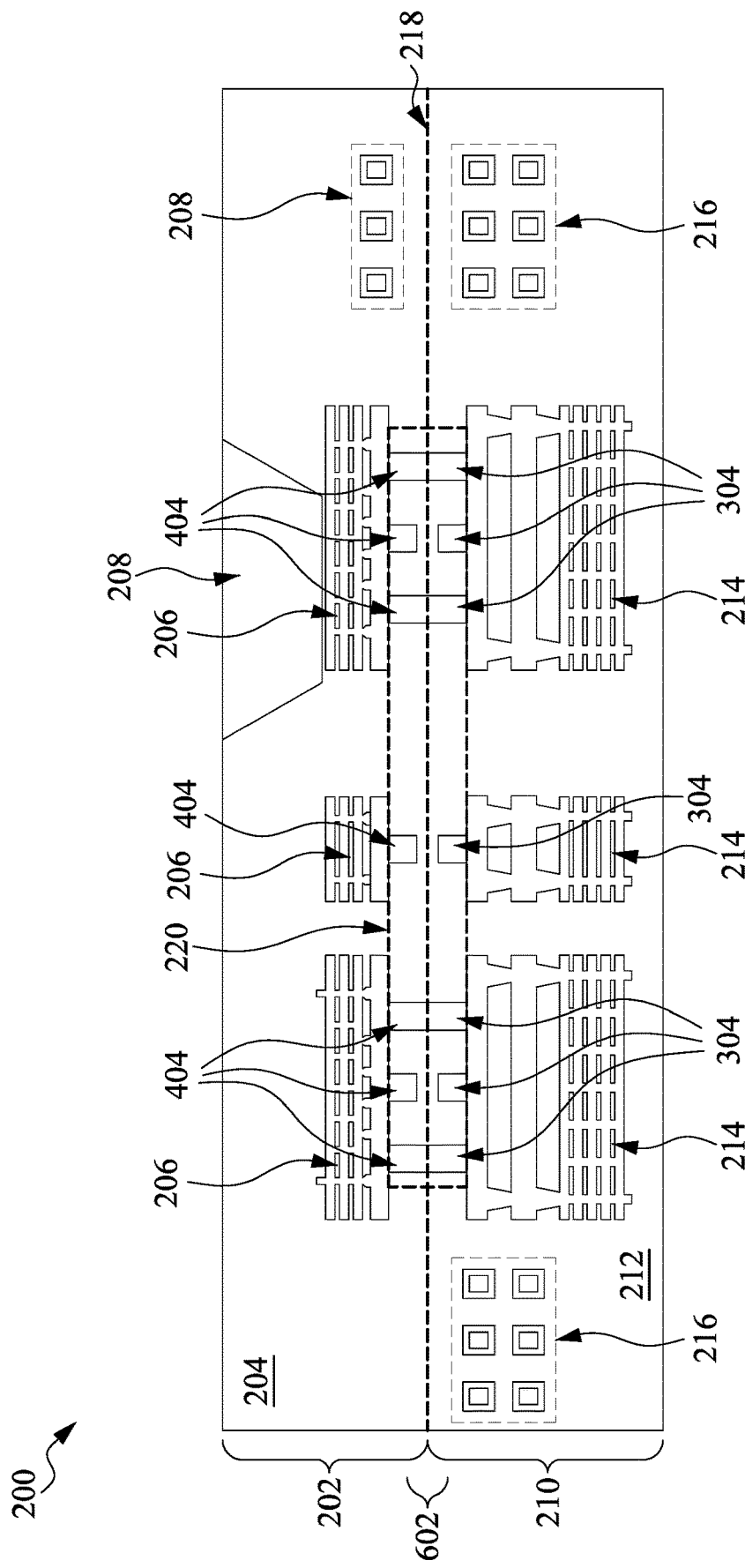
Figure 6G:
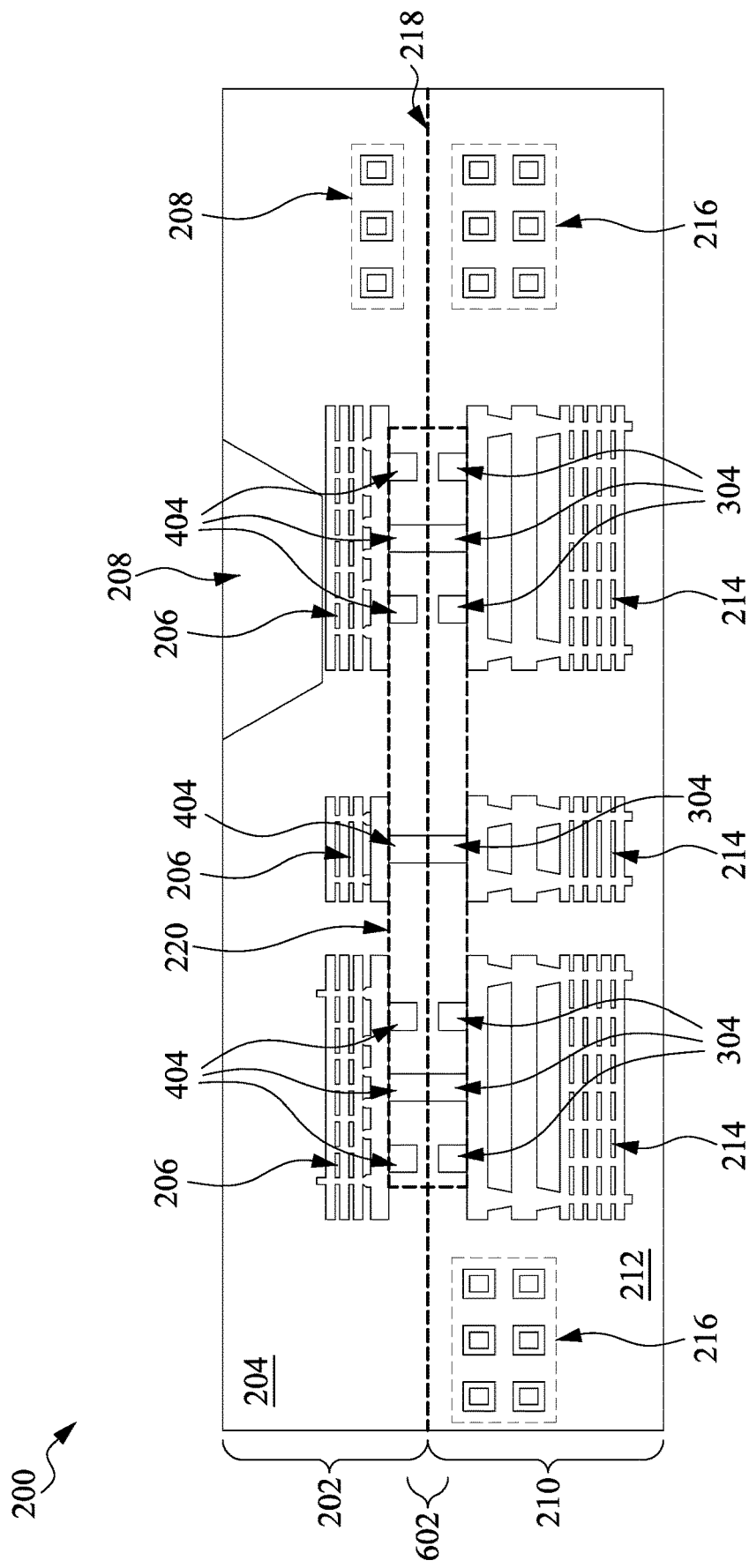

As shown in FIGS. 6F and 6G, a first subset of the set of metal elements 304 may bond to a first subset of the set of metal elements 404 and a second subset of the set of metal elements 304 may be separated (e.g., not bonded) from a second subset of the set of metal elements 404. For example, the set of metal elements 404 may include at least one metal element 404 that is not bonded to any metal element of the set of metal elements 304.

As shown in FIG. 6F, the at least one metal element 404 that is not bonded to any metal element of the set of metal elements 304 may include non-consecutive metal elements 404. In other words, a first element of the at least one metal element 404 may be separated from a second element of the at least one metal element 404 by a metal element of the set of metal elements 404 that is bonded to a metal element 304 of the set of metal elements. In this way, even if the metal bonding structure 220 includes at least one of metal element 404 that is not bonded to any metal element of the set of metal elements 304, the metal bonding structure may provide structural support across the interface 218 without localized weaknesses.

As shown in FIG. 6G, each of the one or more metal structures 206 and the one or more metal structures 214 may be connected via at least one bonded pair of the set of metal elements 304 and the set of metal elements 404. In this way, each of the one or more metal structures 214 may provide structural support to the bond between the first wafer 202 and the second wafer 210.

Figure 6H:
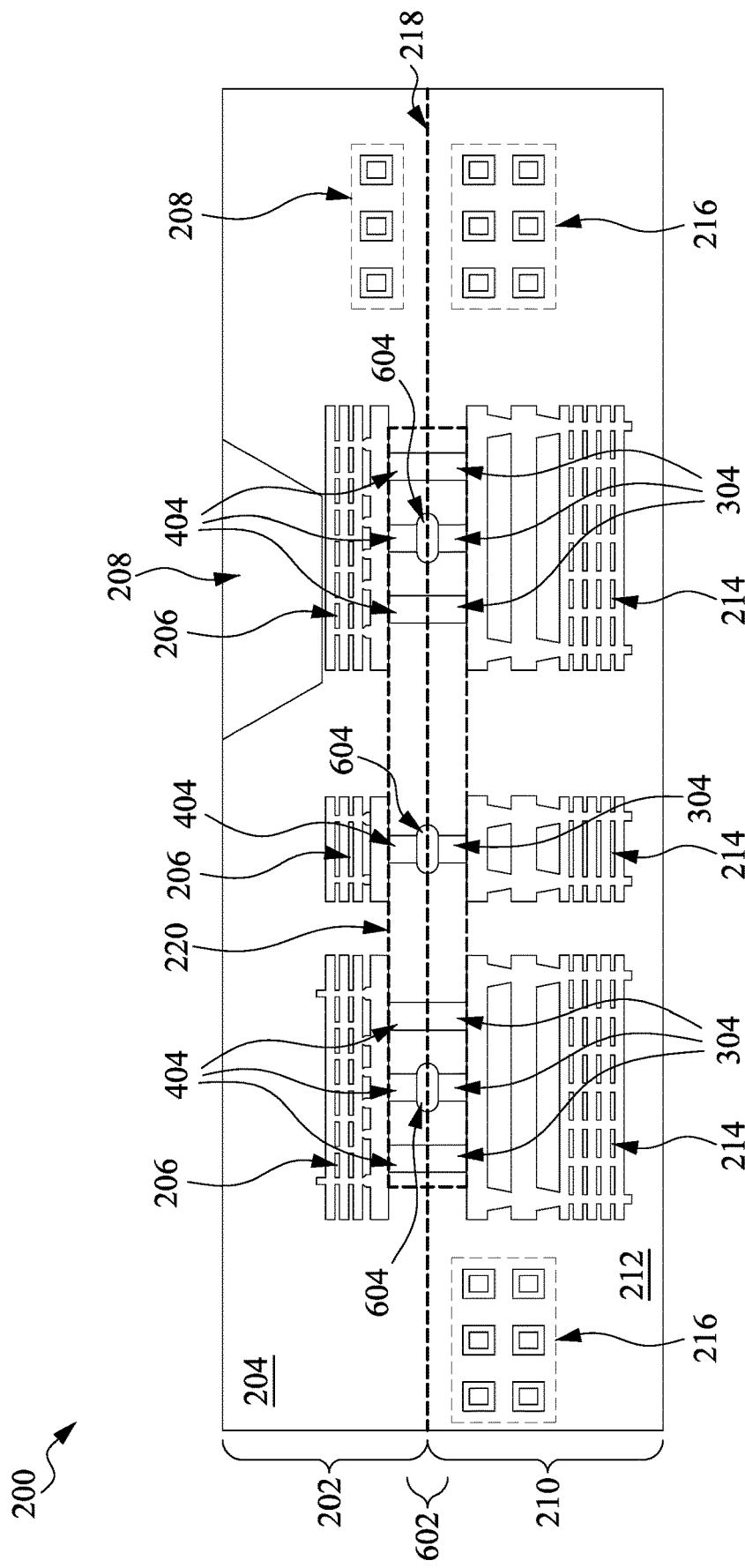
Figure 6I:
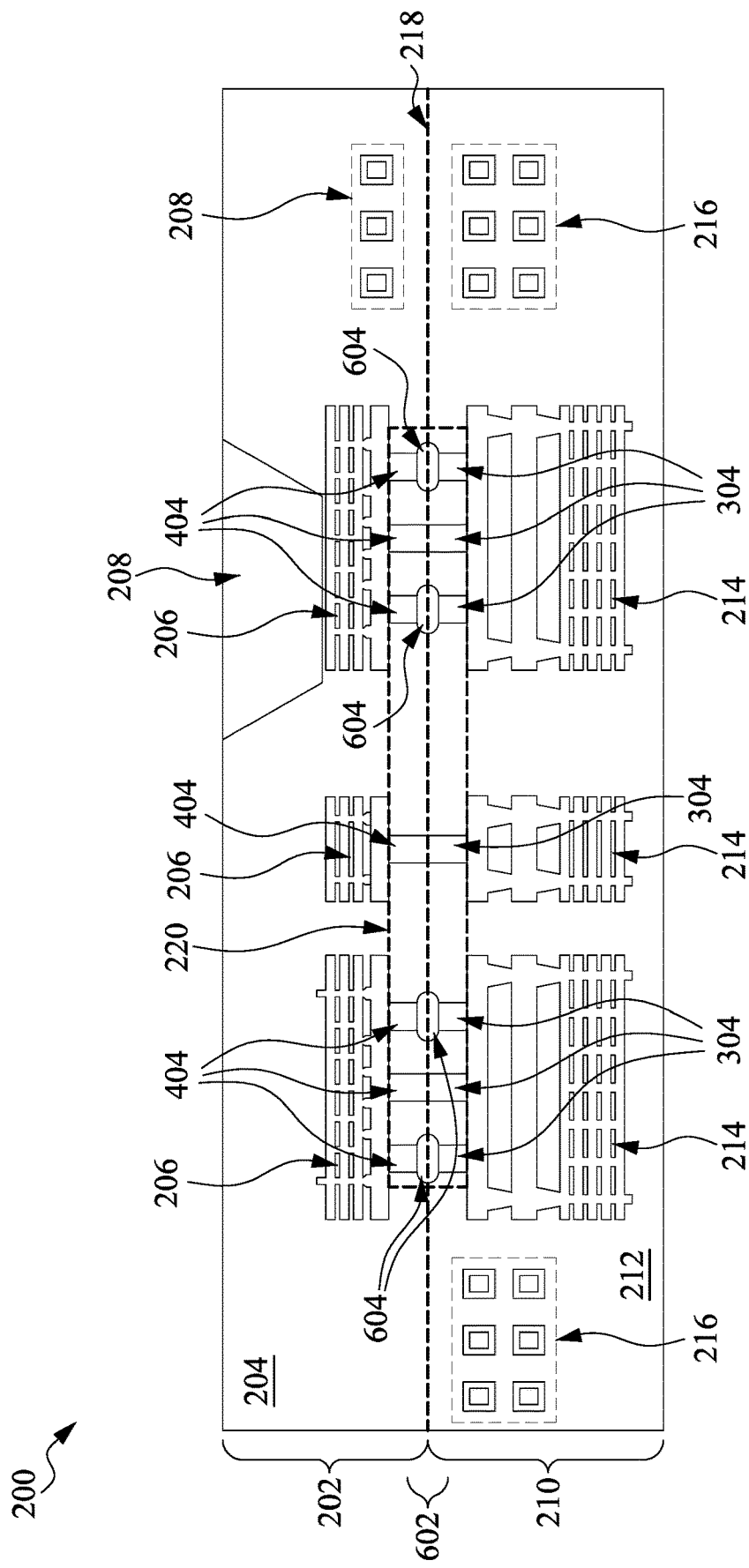

As shown in FIGS. 6H and 6I, a first subset of the set of metal elements 304 may bond to a first subset of the set of metal elements 404 and a second subset of the set of metal elements 304 may be separated from a second subset of the set of metal elements 404. For example, the set of metal elements 404 may include at least one metal element 404 that does not extend to the interface 218 and/or the set of metal elements 304 may include at least one metal element 304 that does not extend to the interface 218. In some implementations, one or more semiconductor tools (e.g., a bonding tool 108 or a deposition tool 102) may deposit solder bumps 604 on one or more elements of the set of metal elements 404 and/or on the set of metal elements 304 before bonding the first wafer 202 to the second wafer 210. In some implementations, the one or more elements of the set of metal element 404 is bonded to the second metal element 304 via a solder bump 604 disposed at the interface 218.

In some implementations, the solder bumps 604 include a solder material, such as tin and silver material, tin, tin and gold material, and/or a lead-free material, among other examples. In some implementations, the solder bumps 604 improve adhesion and/or bonding between the second subset of the set of metal elements 304 and the second subset of the set of metal elements 404 that are separated by the solder bumps 604.

As shown in FIG. 6H, the at least one metal element 404 that is bonded to a metal element of the set of metal elements 304 via a solder bump may include non-consecutive metal elements 404. In other words, a first element of the at least one metal element 404 that is bonded to an element of the set of metal elements 304 via a solder bump may be separated from a second element of the at least one metal element 404 that is bonded to another of the set of metal elements 304 via a solder bump by a metal element of the set of metal elements 404 that is bonded to a metal element 304 of the set of metal elements without a solder bump. In this way, the metal bonding structure 220 may include at least one of metal element 404 that is bonded to a metal element of the set of metal elements 304 via a solder bump that are spaced along the interface 218 to provide additional structural support.

As indicated above, FIGS. 6A-6I are provided as examples. Other examples may differ from what is described with regard to FIGS. 6A-6I.

Figure 7:
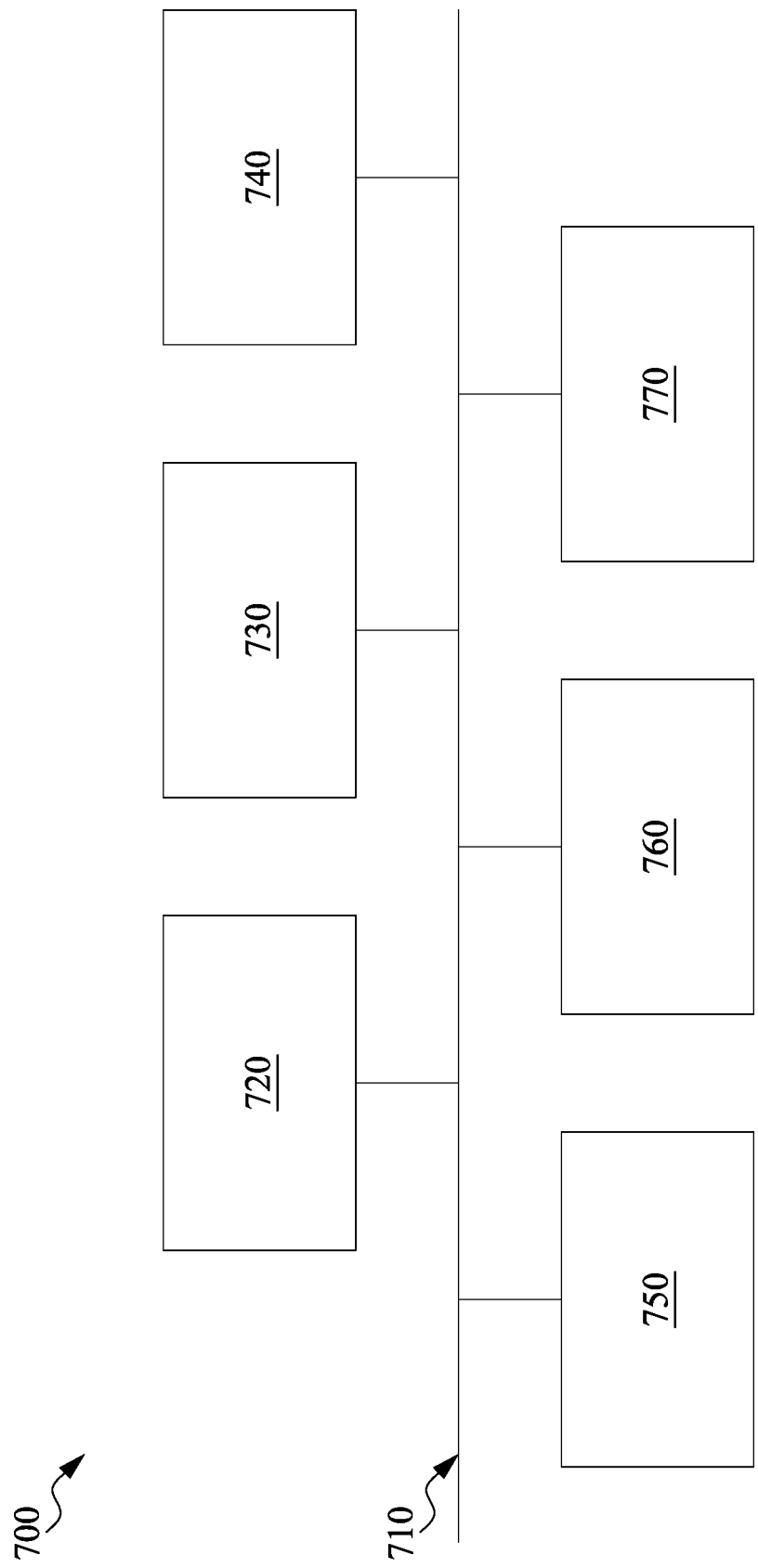
FIG. 7 is a diagram of example components of one or more devices of FIG. 1.

FIG. 7 is a diagram of example components of a device 700, which may correspond to deposition tool 102, etching tool 104, planarization tool 106, bonding tool 108, and/or wafer/die transport tool 110. In some implementations, deposition tool 102, etching tool 104, planarization tool 106, bonding tool 108, and/or wafer/die transport tool 110 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, and/or an actuator. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, and/or an antenna.

Device 700 may perform one or more processes described herein. For example, a non-transitory computer-readable medium (e.g., memory 730 and/or storage component 740) may store a set of instructions (e.g., one or more instructions, code, software code, and/or program code) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hard-wired circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
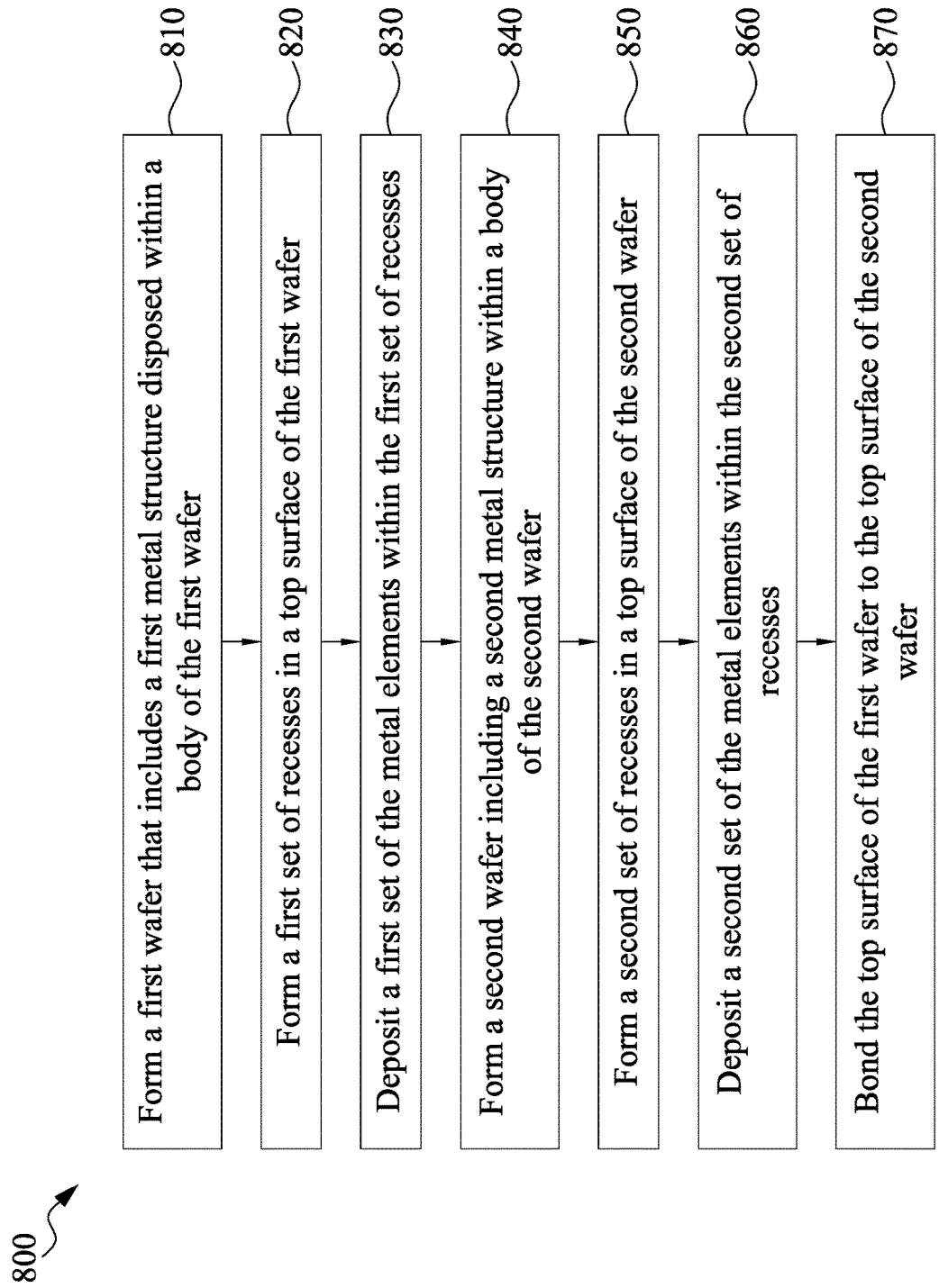
FIG. 8 is a flowchart of an example process relating to forming a metal bonding structure.

FIG. 8 is a flowchart of an example process 800 associated with a metal bonding structure and manufacturing method thereof. In some implementations, one or more process blocks of FIG. 8 may be performed by one or more semiconductor processing tools (e.g., deposition tool 102, etching tool 104, planarization tool 106, bonding tool 108, and/or wafer/die transport tool 110). Additionally, or alternatively, one or more process blocks of FIG. 8 may be performed by one or more components of device 700, such as processor 720, memory 730, storage component 740, input component 750, output component 760, and/or communication component 770.

As shown in FIG. 8, process 800 may include forming a first wafer that includes a first metal structure disposed within a body of the first wafer (block 810). For example, the one or more semiconductor processing tools may form a first wafer 202 that includes a first metal structure 206 disposed within a body 204 of the first wafer 202, as described above.

As further shown in FIG. 8, process 800 may include forming a first set of recessed portions in a top surface of the first wafer (block 820). For example, the one or more semiconductor processing tools may form a first set of recessed portions 402 in a top surface of the first wafer 202, as described above.

As further shown in FIG. 8, process 800 may include depositing a first set of metal elements within the first set of recessed portions (block 830). For example, the one or more semiconductor processing tools may deposit a first set of metal elements 404 within the first set of recessed portions 402, as described above.

As further shown in FIG. 8, process 800 may include forming a second wafer including a second metal structure within a body of the second wafer (block 840). For example, the one or more semiconductor processing tools may form a second wafer 210 including a second metal structure 214 within a body 212 of the second wafer 210, as described above.

As further shown in FIG. 8, process 800 may include forming a second set of recessed portions in a top surface of the second wafer (block 850). For example, the one or more semiconductor processing tools may form a second set of recessed portions 302 in a top surface of the second wafer 210, as described above.

As further shown in FIG. 8, process 800 may include depositing a second set of metal elements within the second set of recessed portions (block 860). For example, the one or more semiconductor processing tools may deposit a second set of metal elements 304 within the second set of recessed portions 302, as described above.

As further shown in FIG. 8, process 800 may include bonding the top surface of the first wafer to the top surface of the second wafer (block 870). For example, the one or more semiconductor processing tools may bond the top surface of the first wafer 202 to the top surface of the second wafer 210, as described above. In some implementations, a first metal element 404 of the first set of metal elements 404 is bonded to a second metal element 304 of the second set of metal elements 304.

Process 800 may include additional implementations, such as any single implementation or any combination of implementations described below and/or in connection with one or more other processes described elsewhere herein.

In a first implementation, process 800 includes one or more of polishing the top surface of the first wafer 202 after depositing the first set of metal elements 404 within the first set of recessed portions 402, or polishing the top surface of the second wafer 210 after depositing the second set of metal elements 304 within the second set of recessed portions 302.

In a second implementation, alone or in combination with the first implementation, process 800 includes depositing a solder bump on one or more elements of the first set of metal elements 404 or the second set of metal elements 304 before bonding the top surface of the first wafer 202 to the top surface of the second wafer 210.

In a third implementation, alone or in combination with one or more of the first and second implementations, the top surface of the first wafer 202 and the top surface of the second wafer 210 comprise a thermal bonding material.

In a fourth implementation, alone or in combination with one or more of the first through third implementations, bonding the top surface of the first wafer 202 to the top surface of the second wafer 210 comprises applying heat to the top surface of the first wafer 202 and to the top surface of the second wafer 210 to bond the top surface of the first wafer 202 to the top surface of the second wafer (210.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Based on a metal bonding structure extending from a first metal structure disposed within a first wafer of an electronic device and a second metal structure disposed within a second wafer of the electronic device, the electronic device may be supported at a bonding interface to reduce lateral shifting between the first wafer and the second wafer, which may reduce a likelihood of cracking between the first wafer and the second wafer.

As described in greater detail above, some implementations described herein provide a semiconductor structure. The semiconductor structure includes a first wafer including a first metal structure within a body of the first wafer. The semiconductor structure also includes a second wafer including a second metal structure within a body of the second wafer, where the first wafer is coupled to the second wafer at an interface. The semiconductor structure further includes a metal bonding structure coupled to the first metal structure and the second metal structure and extending through the interface.

As described in greater detail above, some implementations described herein provide a method. The method includes forming a first wafer that includes a first metal structure disposed within a body of the first wafer. The method also includes forming a first set of recessed portions in a top surface of the first wafer. The method additionally includes depositing a first set of metal elements within the first set of recessed portions. The method also includes forming a second wafer including a second metal structure within a body of the second wafer. The method additionally includes forming a second set of recessed portions in a top surface of the second wafer. The method further includes depositing a second set of metal elements within the second set of recessed portions. The method further includes bonding the top surface of the first wafer to the top surface of the second wafer, where a first metal element of the first set of metal elements is bonded to a second metal element of the second set of metal elements.

As described in greater detail above, some implementations described herein provide a semiconductor structure. The semiconductor structure includes a first wafer including, a first metal structure within a body of the first wafer and a first set of metal elements extending between the first metal structure and a surface of the first wafer. The semiconductor structure also includes a second wafer including a second metal structure within a body of the second wafer and a second set of metal elements extending between the second metal structure and a surface of the second wafer. The first wafer is coupled to the second wafer at an interface, and the first set of metal elements and the second set of metal elements form a metal bonding structure that extends from the first metal structure to the second metal structure through the interface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a first wafer including a first metal structure within a body of the first wafer,
        wherein the first metal structure provides a first lattice structure within the body of the first wafer;
    a second wafer including a second metal structure within a body of the second wafer,
        wherein the second metal structure provides a second lattice structure within the body of the second wafer, and
        wherein the first wafer is coupled to the second wafer at an interface; and
    a metal bonding structure coupled to the first metal structure and the second metal structure and extending through the interface,
        wherein the metal bonding structure comprises:
            a first plurality of metal elements that extend from the first metal structure to the interface, and
            a second plurality of metal elements that extend from the second metal structure to the interface,
                wherein the first plurality of metal elements are bonded to the second plurality of metal elements,
                wherein a first metal element, of the first plurality of metal elements, is bonded to a second metal element, of the second plurality of metal elements, via a solder bump, and
                wherein a third metal element, of the first plurality of metal elements, is bonded to a fourth metal element, of the second plurality of metal elements, without a solder bump.

2. The semiconductor structure of claim 1,
    wherein the first metal element has a first width, and
    wherein the second metal element has a second width that is different from the first width.

3. The semiconductor structure of claim 1,
    wherein the third metal element has a third width, and
    wherein the fourth metal element has a fourth width that is different from the third width.

4. The semiconductor structure of claim 1, wherein one or more of the first plurality of metal elements or the second plurality of metal elements includes at least one metal element that has a sloped side-surface.

5. The semiconductor structure of claim 4, wherein the at least one metal element that has the sloped side-surface comprises:
    a first width at a first end coupled to the first metal structure or the second metal structure, and
    a second width at a second end disposed at the interface, wherein the first width is greater than the second width.

6. The semiconductor structure of claim 1,
    wherein the first metal element extends along, and is centered on, a first logical axis from the first metal structure to the interface,
        wherein the second metal element extends along, and is centered on, a second logical axis from the second metal structure to the interface, and
        wherein the first logical axis is laterally displaced from the second logical axis.

7. The semiconductor structure of claim 1, wherein the first metal structure includes at least one metal element that is not bonded to any metal element of the second plurality of metal elements.

8. The semiconductor structure of claim 1, wherein the metal bonding structure comprises a copper-based material; and
    wherein the first wafer is coupled to the second wafer at the interface via a hybrid bonding region.

9. The semiconductor structure of claim 1, wherein one or more of the first wafer or the second wafer includes a system on chip or an application-specific integrated circuit.

10. The semiconductor structure of claim 1, wherein the first metal structure is embedded within the body of the first wafer at a depth that is less than a width of the first metal structure.

11. The semiconductor structure of claim 1, wherein one or more metal elements, of the first plurality of metal elements, have a different cross-sectional shape from one or more metal elements of the second plurality of metal elements.

12. The semiconductor structure of claim 1, wherein at least one metal element, of the first plurality of metal elements, has a different cross-sectional shape from at least one other metal element of the first plurality of metal elements.

13. A method comprising:
    forming a first wafer that includes a first metal structure disposed within a body of the first wafer,
        wherein the first metal structure provides a first lattice structure within the body of the first wafer;
    forming a first set of recessed portions in a top surface of the first wafer;
    depositing a first plurality of metal elements within the first set of recessed portions;
    forming a second wafer including a second metal structure within a body of the second wafer,
        wherein the second metal structure provides a second lattice structure within the body of the second wafer;

forming a second set of recessed portions in a top surface of the second wafer;

depositing a second plurality of metal elements within the second set of recessed portions;

depositing a solder bump on a first metal element, of the first plurality of metal elements, or a second metal element, the second plurality of metal elements; and bonding the top surface of the first wafer to the top surface of the second wafer, wherein the first plurality of metal elements are bonded to the second plurality of metal elements, wherein the first metal element is bonded to the second metal element via the solder bump, and wherein a third metal element, of the first plurality of metal elements, is bonded to a fourth metal element, of the second plurality of metal elements, without a solder bump.

14. The method of claim 13, further comprising one or more of:

polishing the top surface of the first wafer after depositing the first plurality of metal elements within the first set of recessed portions; or polishing the top surface of the second wafer after depositing the second plurality of metal elements within the second set of recessed portions.

15. The method of claim 13, wherein the top surface of the first wafer and the top surface of the second wafer comprise a thermal bonding material.

16. The method of claim 13, wherein bonding the top surface of the first wafer to the top surface of the second wafer comprises:

applying heat to the top surface of the first wafer and to the top surface of the second wafer to bond the top surface of the first wafer to the top surface of the second wafer.

17. A semiconductor structure comprising:

a first wafer comprising:

a first metal structure that provides a first lattice structure within a body of the first wafer; and a first plurality of metal elements extending between the first metal structure and a surface of the first wafer; and a second wafer comprising:

a second metal structure that provides a second lattice structure within a body of the second wafer; and a second plurality of metal elements extending between the second metal structure and a surface of the second wafer, wherein the first wafer is coupled to the second wafer at an interface, wherein the first plurality of metal elements and the second plurality of metal elements form a metal bonding structure that extends from the first metal structure to the second metal structure through the interface, wherein a first metal element, of the first plurality of metal elements, is bonded to a second metal element, of the second plurality of metal elements, via a solder bump, and wherein a third metal element, of the first plurality of metal elements, is bonded to a fourth metal element, of the second plurality of metal elements, without a solder bump.

18. The semiconductor structure of claim 17, wherein the interface comprises a hybrid bonding region.

19. The semiconductor structure of claim 17, wherein the first metal element has a first width, and wherein the second metal element has a second width that is different from the first width.

20. The semiconductor structure of claim 17, wherein the third metal element has a third width, and wherein the fourth metal element has a fourth width that is different from the third width.

* * * * *